(12) United States Patent
Yun et al.

(10) Patent No.: US 9,646,983 B2
(45) Date of Patent: May 9, 2017

(54) SEMICONDUCTOR DEVICE AND METHOD OF MANUFACTURING THE SAME

(71) Applicants: Jang-gn Yun, Hwaseong-si (KR); Joon Sung Lim, Yongin-si (KR); Jae-ho Ahn, Seoul (KR)

(72) Inventors: Jang-gn Yun, Hwaseong-si (KR); Joon Sung Lim, Yongin-si (KR); Jae-ho Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/963,739

(22) Filed: Dec. 9, 2015

(65) Prior Publication Data
US 2016/0181101 A1 Jun. 23, 2016

(30) Foreign Application Priority Data
Dec. 19, 2014 (KR) .......................... 10-2014-0184968

(51) Int. Cl.
*H01L 21/70* (2006.01)
*H01L 27/11565* (2017.01)
(Continued)

(52) U.S. Cl.
CPC .... *H01L 27/11565* (2013.01); *H01L 21/0337* (2013.01); *H01L 21/3086* (2013.01); *H01L 27/1157* (2013.01); *H01L 27/11519* (2013.01); *H01L 27/11524* (2013.01); *H01L 29/0653* (2013.01)

(58) Field of Classification Search
USPC ................... 257/68–71, 296–309, 905–908, 257/E27.084–E29.097, E27.075, 257/E21.646–E21.66, 42–47, 200–201, 257/388, 407, 412, 442, 614–616, 677, 257/223, 227, 291, 292, 439, 443, 655, 257/E27.1, E27.125, E27.112, E29.117, 257/E29.145, E29.147, E29.151, E29.182,
(Continued)

(56) References Cited

U.S. PATENT DOCUMENTS 6,570,220 B2   5/2003   Doyle et al.
7,291,560 B2   11/2007  Parascandola et al.
(Continued)

FOREIGN PATENT DOCUMENTS

KR   1020130067722 A   6/2013
KR   1020140000568 A   1/2014

*Primary Examiner* — Tram H Nguyen
(74) *Attorney, Agent, or Firm* — Myers Bigel, P.A.

(57) ABSTRACT

A semiconductor device includes a plurality of line patterns including at least two continuous line repetition units having, as one of the line repetition unit, four line patterns continuously arranged in a first direction and having variable widths based on location. To form the plurality of line patterns including the at least two continuous line repetition units, a plurality of reference patterns are formed repeatedly at a uniform reference pitch on a feature layer. A plurality of first spacers covering both side walls of each of the plurality of reference patterns are formed. A plurality of second spacers covering both side walls of each of the plurality of first spacers are formed by removing the plurality of reference patterns. The feature layer is etched using the plurality of second spacers as an etch mask by removing the plurality of first spacers.

18 Claims, 37 Drawing Sheets

(51) Int. Cl.
*H01L 21/033* (2006.01)
*H01L 29/06* (2006.01)
*H01L 27/11519* (2017.01)
*H01L 21/308* (2006.01)
*H01L 27/11524* (2017.01)
*H01L 27/1157* (2017.01)

(58) Field of Classification Search
USPC ..... 257/E29.202, E29.273–E29.299, E29.32, 257/E23.016; 438/149, 163
See application file for complete search history.

(56) References Cited

U.S. PATENT DOCUMENTS

| | | | |
|---|---|---|---|
| 7,795,080 B2 | 9/2010 | Orimoto et al. | |
| 7,807,575 B2 | 10/2010 | Zhou | |
| 8,222,159 B2* | 7/2012 | Sugimura | H01L 21/0337 438/262 |
| 8,389,383 B1 | 3/2013 | Hopkins | |
| 2008/0219054 A1* | 9/2008 | Arai | H01L 27/115 365/185.13 |
| 2014/0017894 A1 | 1/2014 | Tsai et al. | |
| 2014/0042626 A1 | 2/2014 | Matsuno et al. | |
| 2014/0091434 A1 | 4/2014 | Hopkins | |
| 2015/0235964 A1* | 8/2015 | Feng | H01L 23/544 257/786 |
| 2015/0374984 A1* | 12/2015 | King | A61N 1/36014 607/50 |
| 2016/0059009 A1* | 3/2016 | Skiba | A61N 1/30 602/53 |

* cited by examiner

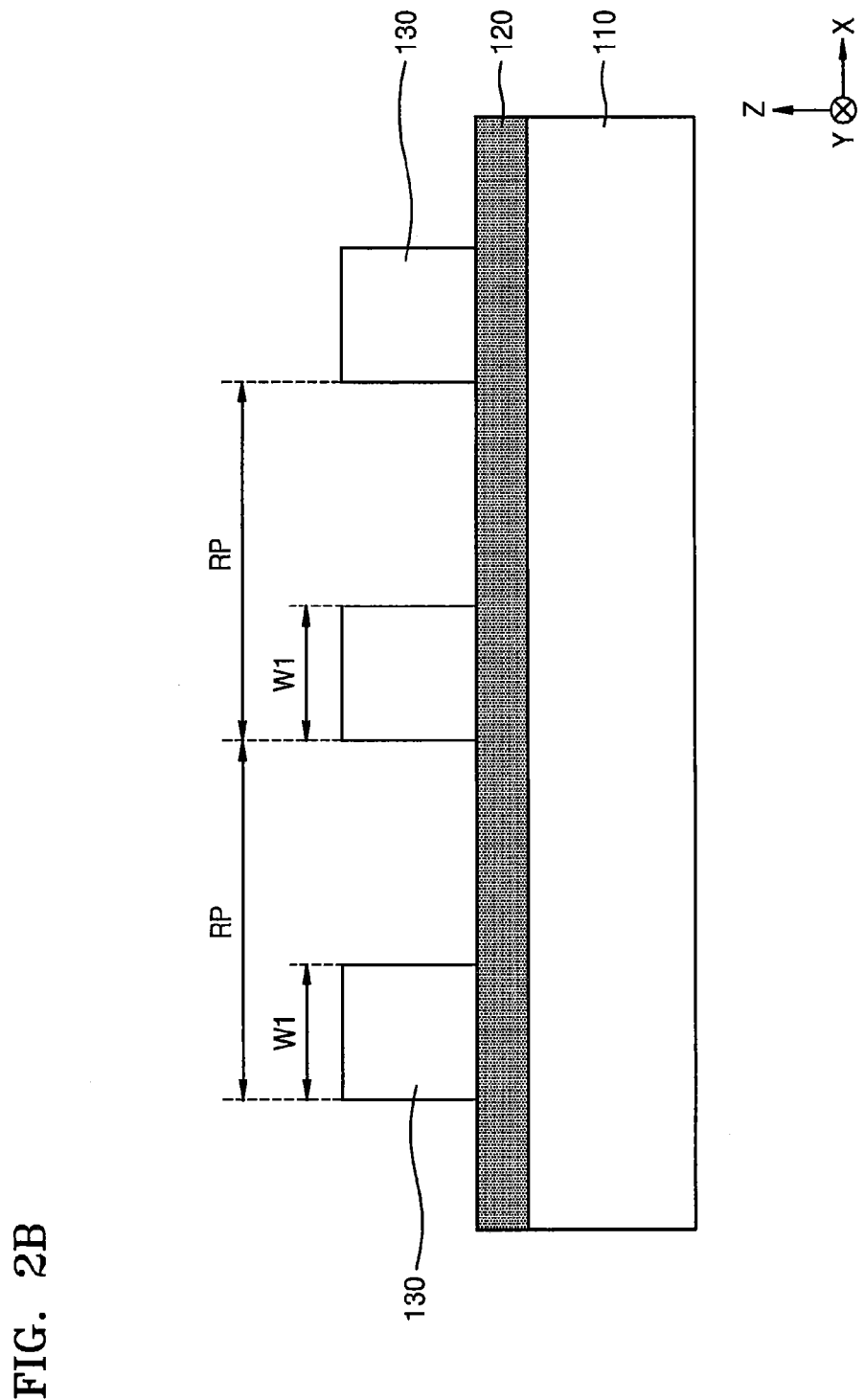

SEMICONDUCTOR DEVICE AND METHOD OF MANUFACTURING THE SAME

CROSS-REFERENCE TO RELATED APPLICATIONS

This application claims the benefit of Korean Patent Application No. 10-2014-0184968, filed on Dec. 19, 2014, in the Korean Intellectual Property Office, the disclosure of which is incorporated herein in its entirety by reference.

BACKGROUND

The inventive concept relates to a semiconductor device and a method of manufacturing the semiconductor device, and more particularly, to a semiconductor device including a plurality of line patterns extending in parallel to each other and a method of manufacturing the semiconductor device.

Micro patterning is indispensable in manufacturing a highly integrated semiconductor device. An individual device needs to be as small as possible to integrate many devices in a narrow area. To this end, a pitch, which is a sum of a width of each of the patterns to be formed and a space between the patterns, needs to be small. As a design rule of a semiconductor device rapidly decreases, there is a limit to forming micro pitch patterns due to a resolution limitation of a photolithography process for forming a pattern necessary for creating the semiconductor device. Furthermore, there is a need to vary a critical dimension (CD) of micro patterns and a CD of spaces between the micro patterns in consideration of various process variables so as to manufacture a highly scaled and integrated semiconductor device.

SUMMARY

The inventive concept provides a semiconductor device in which micro patterns having various widths and exceeding a resolution limitation of a photolithography process are repeatedly formed at a predetermined cycle to create a resultant structure for reducing or preventing a defect caused by various process variables.

The inventive concept also provides a method of manufacturing a semiconductor device capable of reducing an application number of times of a photolithography process, reducing or preventing a defect caused by various process variables, and simultaneously forming micro patterns having various widths and exceeding a resolution limitation of the photolithography process.

According to an aspect of the inventive concept, there is provided a semiconductor device including: a plurality of line patterns formed on a substrate, wherein the plurality of line patterns include at least two continuous line repetition units having, as one of the line repetition units, four line patterns continuously arranged in a first direction and having variable widths based on location. The at least two line repetition units have a same width.

One of the line repetition units included in the plurality of line patterns includes: a first line pattern having a first width in the first direction; a second line pattern adjacent to the first line pattern and having a second width greater than the first width in the first direction; a third line pattern adjacent to the second line pattern and having a third width greater than the first width in the first direction; and a fourth line pattern adjacent to the third line pattern and having a fourth width smaller than the third width in the first direction.

The second width and the third width may have a same size.

The first width and the fourth width have a same size.

Widths of the plurality of line patterns may be defined by a plurality of spaces disposed between the plurality of line patterns. The plurality of spaces may include at least two continuous space repetition units having, as one space repetition unit, four spaces continuously arranged in the first direction and having variable widths based on location. The at least two space repetition units may have a same width.

One of the space repetition units included in the plurality of spaces may include: a first space having a fifth width in the first direction; a second space adjacent to the first space and having a sixth width greater than the fifth width in the first direction; a third space adjacent to the second space and having a seventh width smaller than the sixth width in the first direction; and a fourth space adjacent to the third space and having an eighth width greater than the seventh width in the first direction. The fifth width and the seventh width have a same size. The sixth width and the eighth width may have a same size. The first width and the fifth width may have a same size.

According to another aspect of the inventive concept, there is provided a semiconductor device including: a plurality of device isolation regions defining a plurality of active regions in a plurality of line shapes extending in parallel to each other on a substrate, wherein the plurality of active regions include at least two continuous active region repetition units having, as one of the active region repetition unit, four active regions continuously arranged in a first direction and having variable widths based on location. The at least two active region repetition units may have a same width.

One of the active region repetition units may include: a first active region having a first width in the first direction; a second active region adjacent to the first active region and having a second width greater than the first width in the first direction; a third active region adjacent to the second active region and having a third width greater than the first width in the first direction; and a fourth active region adjacent to the third active region and having a fourth width smaller than the third width in the first direction. The second width and the third width may have a same size. The first width and the fourth width may have a same size.

The plurality of active regions and the plurality of device isolation regions may be alternately arranged in the first direction. The plurality of device isolation regions may include at least two continuous device isolation region repetition units having, as one of the device isolation region repetition units, four device isolation regions continuously arranged in the first direction and having variable widths based on location. The at least two device isolation region repetition units may have a same width.

The plurality of device isolation regions may include a plurality of device isolation air gaps each disposed in each of the plurality of device isolation regions. The plurality of device isolation air gaps may include at least two continuous device isolation air gap repetition units having four device isolation air gaps continuously arranged in the first direction and having variable widths based on location as one device isolation air gap repetition unit.

One of the device isolation air gap repetition units may include: a first device isolation air gap; a second device isolation air gap adjacent to the first device isolation air gap and having a width greater than a width of the first device isolation air gap in the first direction; a third device isolation air gap adjacent to the second device isolation air gap and having a width smaller than the width of the second device isolation air gap in the first direction; and a fourth device isolation air gap adjacent to the third device isolation air gap and having a width greater than the width of the third device isolation air gap in the first direction.

According to another aspect of the inventive concept, there is provided a semiconductor device including: a plurality of conductive lines spaced apart from each other on a substrate and extending in parallel to each other, wherein the plurality of conductive lines include at least two continuous conductive line repetition units having, as one of the conductive line repetition units, four conductive lines continuously arranged in a first direction and having variable widths based on location. The at least two conductive line repetition units may have a same width.

One of the conductive line repetition units may include: a first conductive line having a first width in the first direction; a second conductive line adjacent to the first conductive line and having a second width greater than the first width in the first direction; a third conductive line adjacent to the second conductive line and having a third width greater than the first width in the first direction; and a fourth conductive line adjacent to the third conductive line and having a fourth width smaller than the third width in the first direction. The second width and the third width may have a same size. The first width and the fourth width may have a same size.

The semiconductor device may further include: a plurality of inter-conductive line insulation regions filling spaces between the plurality of conductive lines. The plurality of inter-conductive line insulation regions includes at least two continuous insulation repetition units having, as one of the insulation repetition units, four inter-conductive line insulation regions continuously arranged in the first direction and having variable widths based on location, and the at least two insulation repetition units have a same width.

The plurality of inter-conductive line insulation regions may include a plurality of insulation air gaps each disposed in each of the plurality of inter-conductive line insulation regions. The plurality of insulation air gaps include at least two continuous insulation air gap repetition units having, as one of the insulation air gap repetition units, four insulation air gaps continuously arranged in the first direction and having variable widths based on location.

One of the insulation air gap repetition units may include: a first insulation air gap; a second insulation air gap adjacent to the first insulation air gap and having a width greater than a width of the first insulation air gap in the first direction; a third insulation air gap adjacent to the second insulation air gap and having a width smaller than the width of the second insulation air gap in the first direction; and a fourth insulation air gap adjacent to the third insulation air gap and having a width greater than the width of the third insulation air gap in the first direction.

According to another aspect of the inventive concept, there is provided a method of manufacturing a semiconductor device. The method forms a feature layer on a substrate. The method forms a plurality of reference patterns repeatedly at a uniform reference pitch on the feature layer. The method forms a plurality of first spacers covering both side walls of each of the plurality of reference patterns. The method exposes a first surface of the feature layer by removing the plurality of reference patterns. The method forms a plurality of second spacers covering both side walls of each of the plurality of first spacers. The method removes the plurality of first spacers. The method forms a plurality of line patterns by etching the feature layer using the plurality of second spacers as an etch mask. The plurality of line patterns include at least two continuous line repetition units having, as one of the line repetition units, four line patterns continuously arranged in a first direction and having variable widths based on location, and the at least two line repetition units have a same width.

The forming of the plurality of second spacers may include forming a second spacer forming liner covering an exposed surface of each of the plurality of first spacers and a first surface of the feature layer at a uniform thickness; and allowing the plurality of second spacers that are a remaining part of the second spacer forming liner to remain by etching back the second spacer forming liner such that a part of the first surface of the feature layer is exposed. The forming of the plurality of reference patterns includes: determining widths of the plurality of line patterns in the first direction based on a process variation that occurs in the forming of the plurality of second spacers. The forming of the plurality of first spacers includes: determining widths of the plurality of first spacers in the first direction based on the process variation that occurs in the forming of the plurality of second spacers. The forming of the second spacer forming liner includes: determining a width of the second spacer forming liner in the first direction based on the process variation that occurs in the forming of the plurality of second spacers.

When a minimum feature size is 1 F in the first direction, the reference pitch may be 8 F. The forming of the plurality of reference patterns includes: determining a width of each of the plurality of reference patterns by selecting one of cases in which the width of each of the plurality of reference patterns in the first direction is smaller than 3 F, is 3 F, and is greater than 3 F.

When the minimum feature size is 1 F in the first direction, the reference pitch may be 8 F. The forming of the plurality of first spacers includes: determining a width of each of the plurality of second spacers by selecting one of cases in which the width of each of the plurality of second spacers in the first direction is smaller than 1 F, is 1 F, and is greater than 1 F.

When the minimum feature size is 1 F in the first direction, the reference pitch may be 8 F. The forming of the second spacer forming liner includes: determining a width of the second spacer forming liner by selecting one of cases in which a width of a part of the second spacer forming liner that covers both side walls of the plurality of first spacers in the first direction is smaller than 1 F, is 1 F, and is greater than 1 F.

When the minimum feature size is 1 F in the first direction, the reference pitch may be 8 F, the plurality of reference patterns are formed to have widths greater than 3 F in the first direction, the plurality of first spacers are formed to have widths of 1 F in the first direction, and the second spacer forming liner is formed to have a width smaller than 1 F in the first direction.

The method may further include: after forming the plurality of line patterns, defining a plurality of active regions on the substrate by etching the substrate using the plurality of line patterns as the etch mask. The defining of the plurality of active regions includes: forming the plurality of active regions to include at least two continuous active region repetition units having, as one of the active region repetition units, four active regions continuously arranged in the first direction and having variable widths based on location.

The defining of the plurality of active regions includes: forming the one of the active region repetition units to include a first active region, a second active region, a third active region, and a fourth active region that are sequentially arranged in the first direction. The first active region has a first width in the first direction. The second active region has a second width greater than the first width in the first direction. The third active region has a third width greater than the first width in the first direction. The fourth active region has a fourth width smaller than the third width in the first direction.

The method may further include: before forming the feature layer, forming a conducive layer on the substrate; and after forming the plurality of line patterns, forming a plurality of conductive lines by etching the conductive layer using the plurality of line patterns as an etch mask. The forming of the plurality of conductive lines includes: forming the plurality of conductive lines to include at least two continuous conductive line repetition units having, as one of the conductive line repetition units, four conductive lines continuously arranged in a first direction and having variable widths based on location.

The forming of the plurality of conductive lines may include: forming the one of the conductive line repetition units to include a first conductive line, a second conductive line, a third conductive line, and a fourth conductive line that are sequentially arranged in the first direction. The first conductive line has a first width in the first direction. The second conductive line has a second width greater than the first width in the first direction. The third conductive line has a third width greater than the first width in the first direction. The fourth conductive line has a fourth width smaller than the third width in the first direction.

Other methods, systems, and/or devices according to embodiments of the inventive subject matter will be or become apparent to one with skill in the art upon review of the following drawings and detailed description. It is intended that all such additional methods, systems, and/or devices be included within this description, be within the scope of the present inventive concepts, and be protected by the accompanying claims. Moreover, it is intended that all embodiments disclosed herein can be implemented separately or combined in any way and/or combination.

BRIEF DESCRIPTION OF THE DRAWINGS

Exemplary embodiments of the inventive concept will be more clearly understood from the following detailed description taken in conjunction with the accompanying drawings in which:

FIGS. 2A through 2J are cross-sectional views sequentially showing a method of manufacturing a semiconductor device, according to embodiments of the inventive concept;

FIGS. 11A and 11B are diagrams illustrating a semiconductor device and a method of manufacturing the semiconductor device, according to various embodiments of the inventive concept, in which FIG. 11A is a layout of partial elements of a memory cell array of a nonvolatile memory device according to an embodiment of the inventive concept, and FIG. 11B is a perspective view of partial elements of the memory cell array of the nonvolatile memory device according to an embodiment of the inventive concept;

DETAILED DESCRIPTION OF THE EMBODIMENTS

Figure 1:
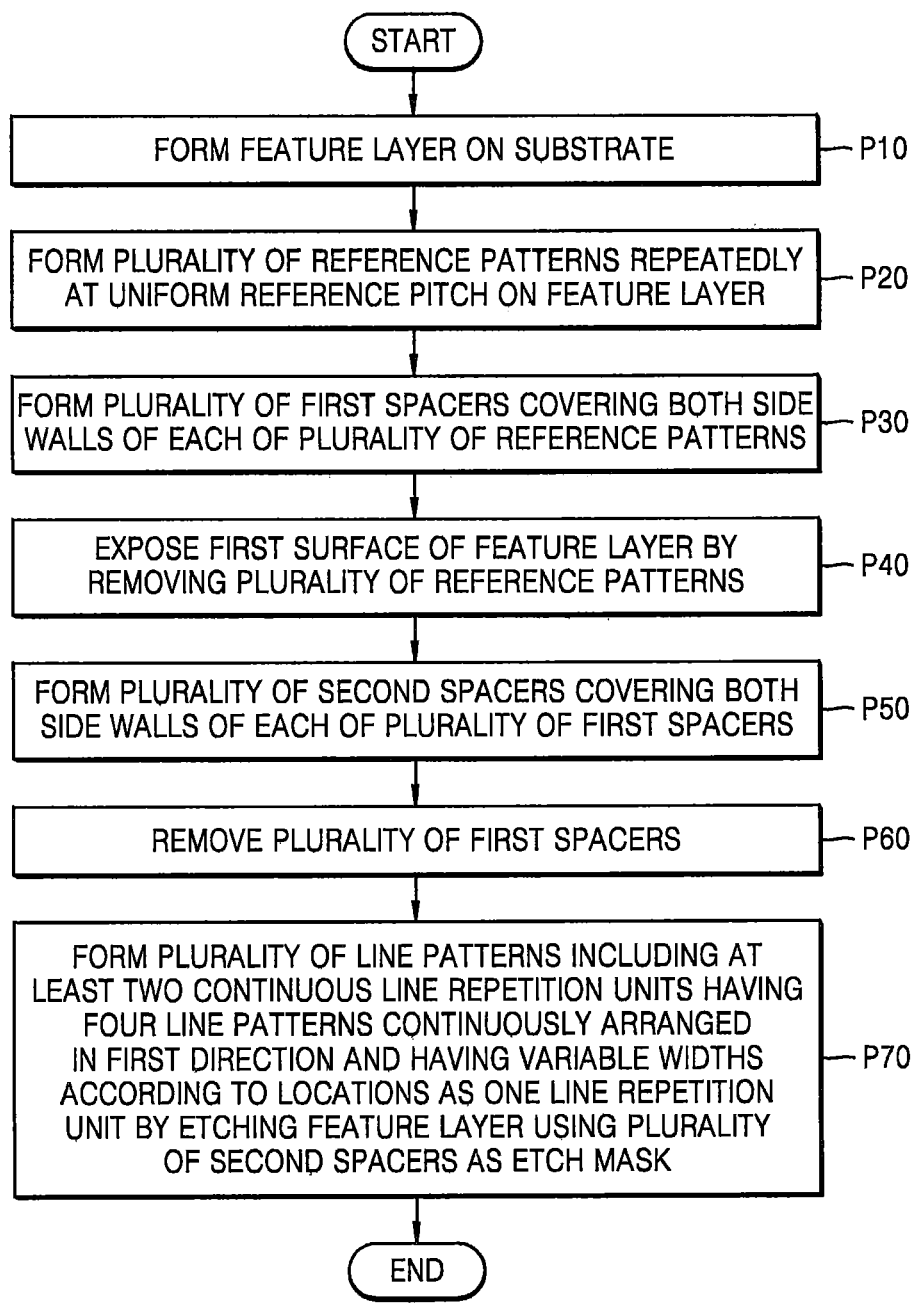
FIG. 1 is a flowchart of a method of manufacturing a semiconductor device, according to an embodiment of the inventive concept.

Hereinafter, the inventive concept will be described in detail by explaining exemplary embodiments of the invention with reference to the attached drawings. Like reference numerals in the drawings denote like elements, and thus their description will be omitted.

The inventive concept may, however, be embodied in many different forms and should not be construed as limited to the exemplary embodiments set forth herein. Rather, these embodiments are provided so that this disclosure will be thorough and complete, and will fully convey the scope of the inventive concept to those skilled in the art. In the drawings, lengths and sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Also, though terms like 'first' and 'second' are used to describe various elements, components, regions, layers, and/or portions in various embodiments of the inventive concept, the elements, components, regions, layers, and/or portions should not be limited by these terms. These terms are only used to distinguish one element, component, region, layer, or portion from another. Thus, a first element, component, region, layer or section discussed below could be termed a second element, component, region, layer or section without departing from the teachings of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

When a certain embodiment can be embodied in a different manner, a specified process order may be performed in a different manner in order to be described. For example, two processes to be described sequentially may be substantially performed at the same time or may be performed in an order opposite to the order to be described.

As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. As used herein, the term "and/or" includes any and all combinations of one or more of the associated listed items.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a flowchart of a method of manufacturing a semiconductor device, according to an embodiment of the inventive concept.

FIGS. 2A through 2J are cross-sectional views sequentially showing a method of manufacturing a semiconductor device, according to embodiments of the inventive concept.

The method of manufacturing the semiconductor device according to an embodiment of the inventive concept using a quadruple patterning technology (QPT) process including a photolithography process one time and a double patterning process two times will be described with reference to FIGS. 1 through 2J.

Figure 2A:
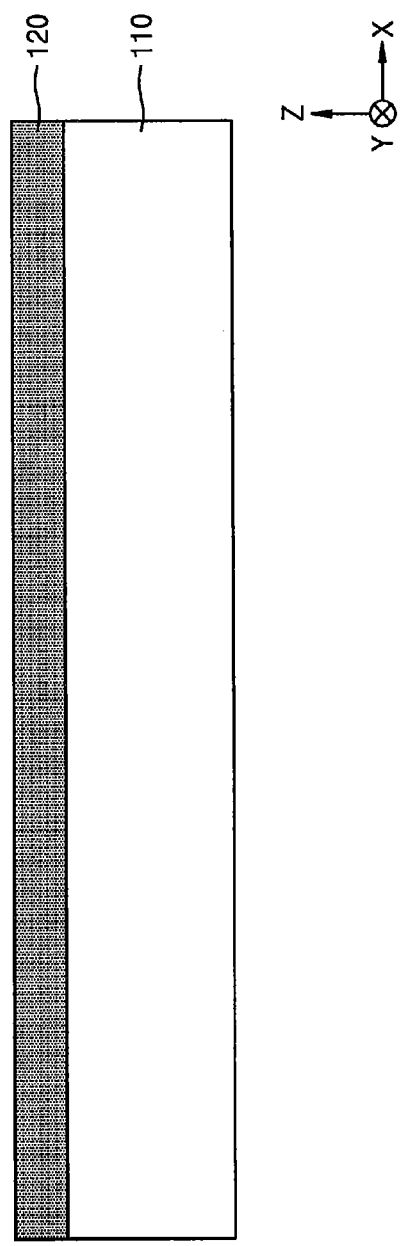

Referring to FIGS. 1 and 2A, in process P10, a feature layer 120 is formed on a substrate 110.

The substrate 110 may be a semiconductor substrate. In some embodiments, the substrate 110 may be formed of a semiconductor, such as silicon (Si) or germanium (Ge). In other some embodiments, the substrate 110 may include a compound semiconductor such as silicon germanium (SiGe), silicon carbide (SiC), gallium arsenide (GaAs), indium arsenide (InAs), or indium phosphide (InP). In some other embodiments, the substrate 110 may have a silicon on insulator (SOI) structure. The substrate 110 may include a conductive area, for example, a well doped with impurities or a structure doped with impurities. The substrate 110 may have various device isolation structures, such as a shallow trench isolation (STI) structure.

The feature layer 120 may be an insulation film or a conductive film. For example, the feature layer 120 may be formed of metal, an alloy, a metal carbide, a metal nitride, a metal oxynitride, a metal oxycarbide, a semiconductor, a polysilicon, an oxide, a nitride, an oxynitride, a hydrocarbon compound, or a combination of these, but is not limited thereto.

Referring to FIGS. 1 and 2B, in process P20, a plurality of reference patterns 130 are repeatedly formed on the feature layer 120 in a first direction (X direction) at a uniform reference pitch RP.

The plurality of reference patterns 130 are formed of a material having an etch selectivity with respect to the feature layer 120 and a first spacer forming liner 140 that is formed in a subsequent process as will be described with reference to FIGS. 2C and 2D. In some embodiments, the plurality of reference patterns 130 may be formed as a silicon nitride film, a silicon oxide film, or a polysilicon film but is not limited thereto.

In some embodiments, the plurality of reference patterns 130 may be formed by forming a preparatory film for forming the plurality of reference patterns 130 on the feature layer 120, forming a photoresist pattern (not shown) on the preparatory film through a photolithography process, and etching the preparatory film by using the photoresist pattern as an etch mask, and thus, the plurality of reference patterns 130 may remain on the feature layer 120.

A width W1 of the plurality of reference patterns 130 in the first direction (X direction) may be determined in consideration of a process variation in an operation of forming a plurality of second spacers 150S that will be described with reference to FIGS. 2F, 2G, 3A, and 3B. In some embodiments, when a minimum feature size in the first direction (X direction) is 1 F, the reference pitch RP may be 8 F. In some embodiments, when the reference pitch RP is 8 F, the width W1 of the plurality of reference patterns 130 may be set smaller than 3 F in consideration of a process variation in an operation of forming the plurality of second spacers 150S that will be described with reference to FIGS. 2C and 2D. In some other embodiments, when the reference pitch RP is 8 F, the width W1 of the plurality of reference patterns 130 may be set as 3 F in consideration of the process variation in the operation of forming the plurality of second spacers 150S. In some other embodiments, when the reference pitch RP is 8 F, the width W1 of the plurality of reference patterns 130 may be set greater than 3 F in consideration of the process variation in the operation of forming the plurality of second spacers 150S.

Figure 2C:
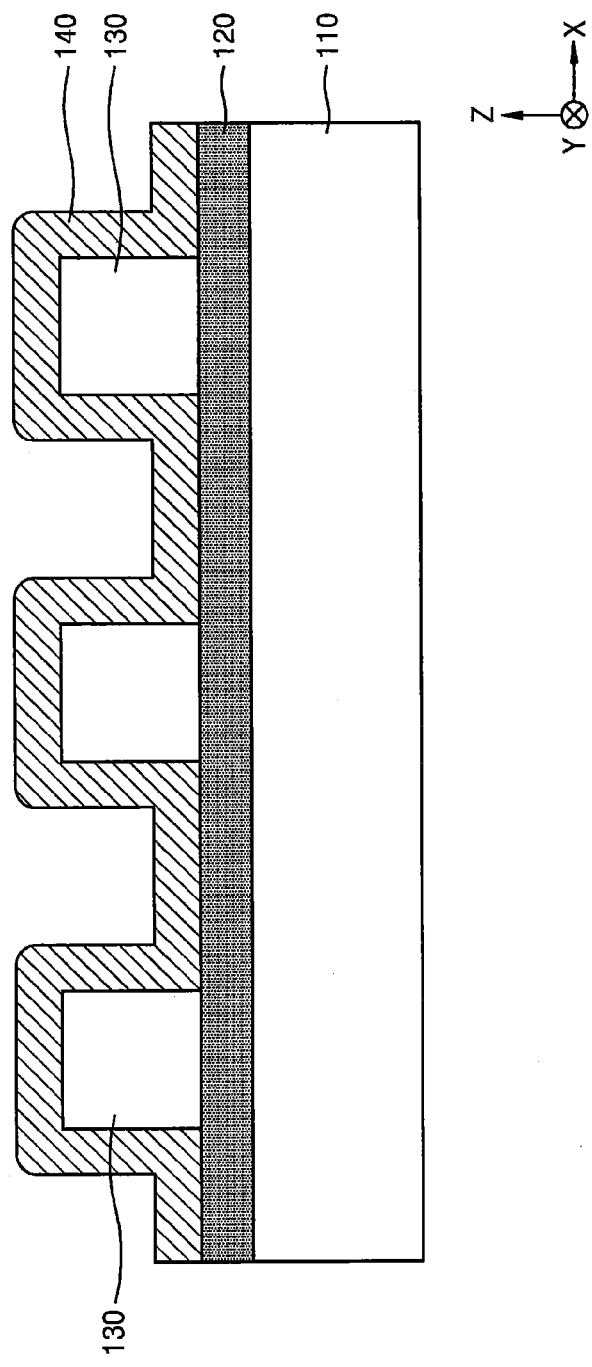
Figure 2D:
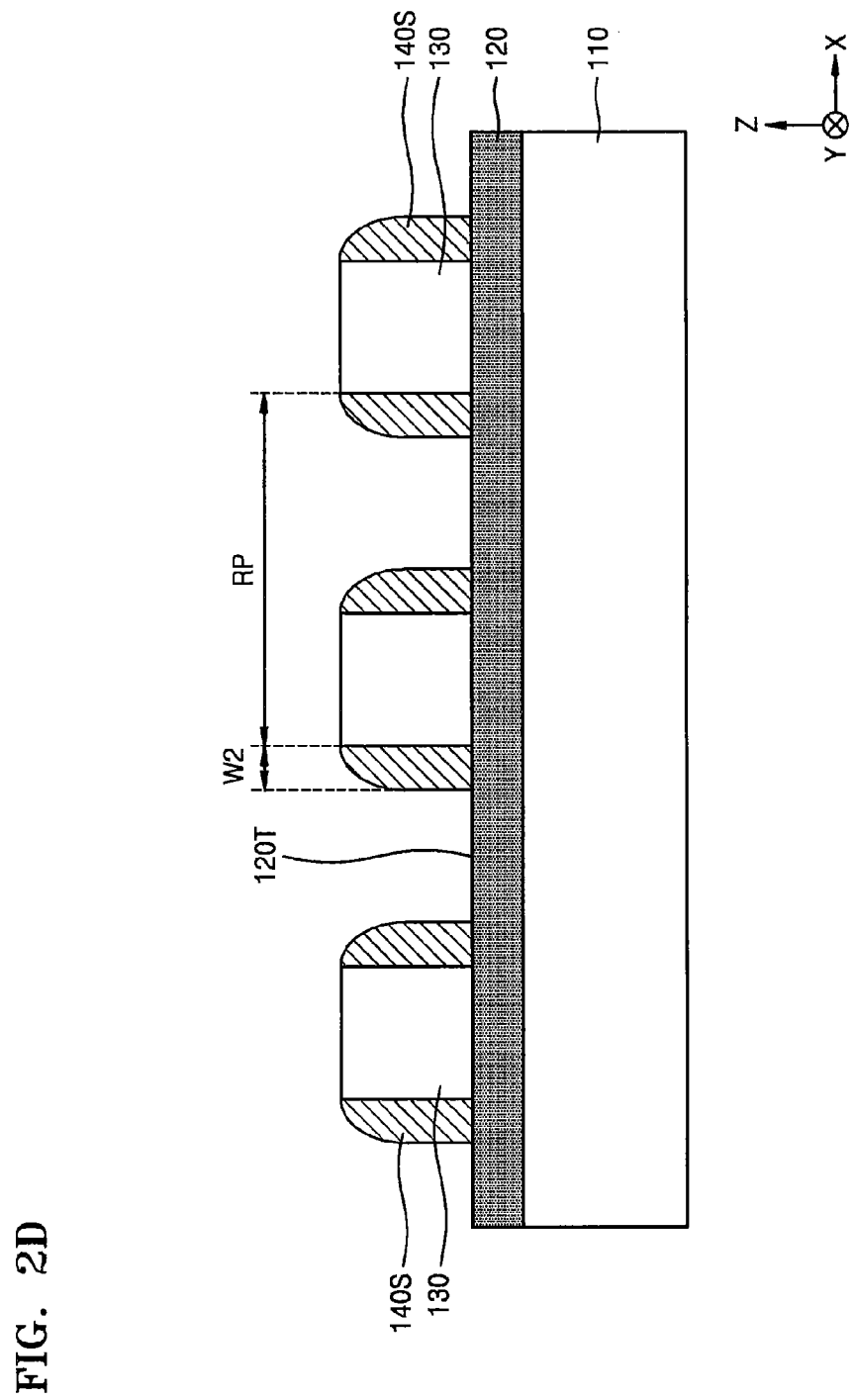

Referring to FIGS. 1, 2C, and 2D, in process P30, a plurality of first spacers 140S covering both side walls of each of the plurality of reference patterns 130 are formed.

In some embodiments, as shown in FIG. 2C, the plurality of first spacers 140S may be formed by forming a first spacer forming liner 140 covering exposed surfaces of the plurality of reference patterns 130 and an exposed surface of the feature layer 120 at a uniform thickness, and etching back the first spacer forming liner 140, such that a part of a top surface of each of the plurality of reference patterns 130 and a top surface 120T of the feature layer 120 may be exposed, and thus, the plurality of first spacers 140S that is a remaining part of the first spacer forming liner 140 may remain.

In some other embodiments, the plurality of first spacers 140S may be formed by performing a process of forming a preparatory spacer film having a planar top surface while filling spaces between the plurality of reference patterns 130 in a resultant structure on which the plurality of reference patterns 130 are formed and etching back the preparatory spacer film without forming the first spacer forming liner 140 of FIG. 2C.

The plurality of first spacers 140S may be formed of a material having a sufficient etch selectivity with respect to the feature layer 120, the plurality of reference patterns 130, and a plurality of second spacers 150S formed in a subsequent process that will be described with reference to FIGS. 2F and 2G. In some embodiments, the plurality of first spacers 140S may be formed of a spin-on hardmask (SOH) material. In some embodiments, the SOH material may be formed of a hydrocarbon compound or its derivatives having a relatively high carbon content ranging from about 85 w % to about 99 w % with respect to the gross weight of the SOH material. However, the inventive concept is not limited to using the above material for the plurality of first spacers 140S.

A width W2 of the plurality of first spacers 140S in the first direction (X direction) may be determined in consideration of a process variation in the operation of forming the plurality of second spacers 150S that will be described with reference to FIGS. 2F, 2G, 3A, and 3B. In some embodiments, when a minimum feature size in the first direction (X direction) is 1 F, and the reference pitch RP is 8 F, the width W2 of the plurality of first spacers 140S may be set smaller than 1 F in consideration of a process variation in an operation of forming the plurality of second spacers 150S that will be described with reference to FIGS. 2F and 2G. In some other embodiments, when the reference pitch RP is 1 F, and the reference pitch RP is 8 F, the width W2 of the plurality of first spacers 140S may be set as 1 F in consideration of the process variation in the operation of forming the plurality of second spacers 150S. In some other embodiments, when the reference pitch RP is 1 F, and the reference pitch RP is 8 F, the width W2 of the plurality of first spacers 140S may be set greater than 1 F in consideration of the process variation in the operation of forming the plurality of second spacers 150S.

Figure 2E:
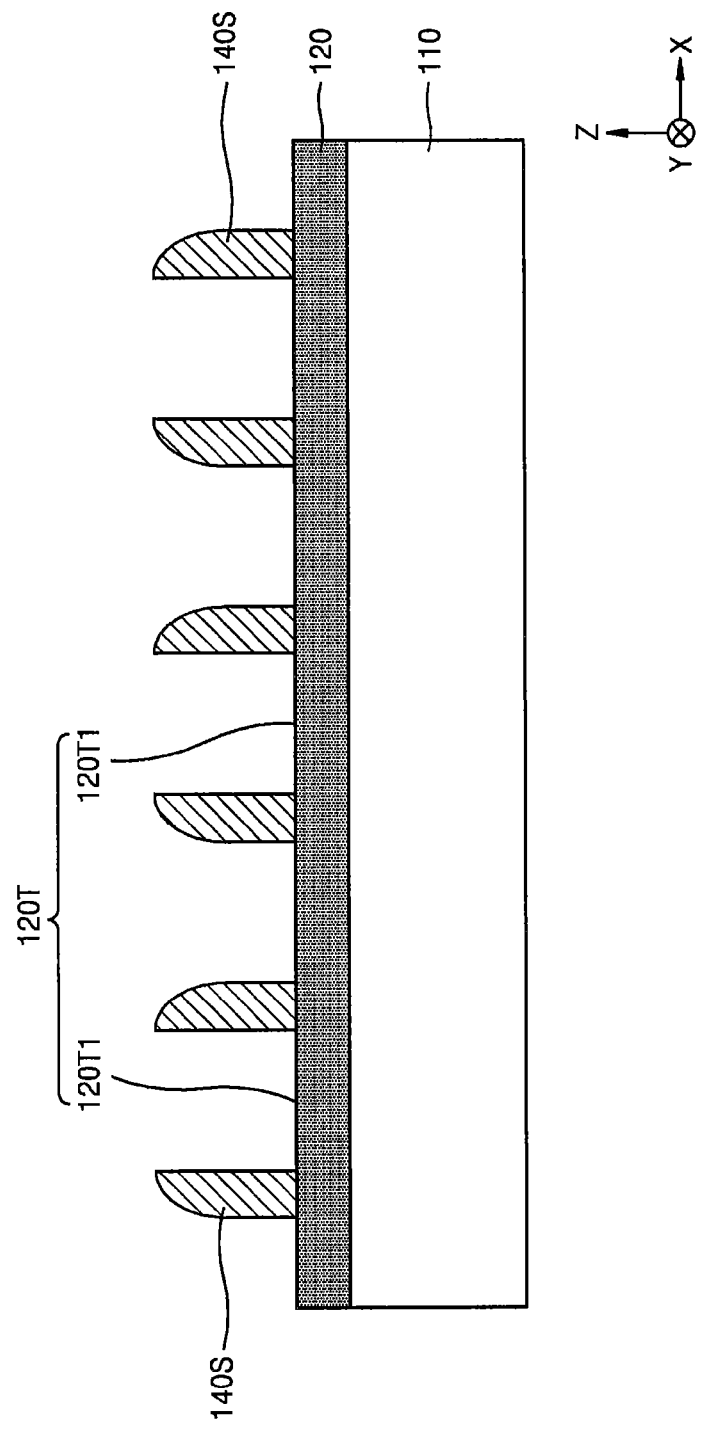

Referring to FIGS. 1 and 2E, in process P40, the plurality of reference patterns 130 (see FIG. 2D) are removed.

Figure 2F:
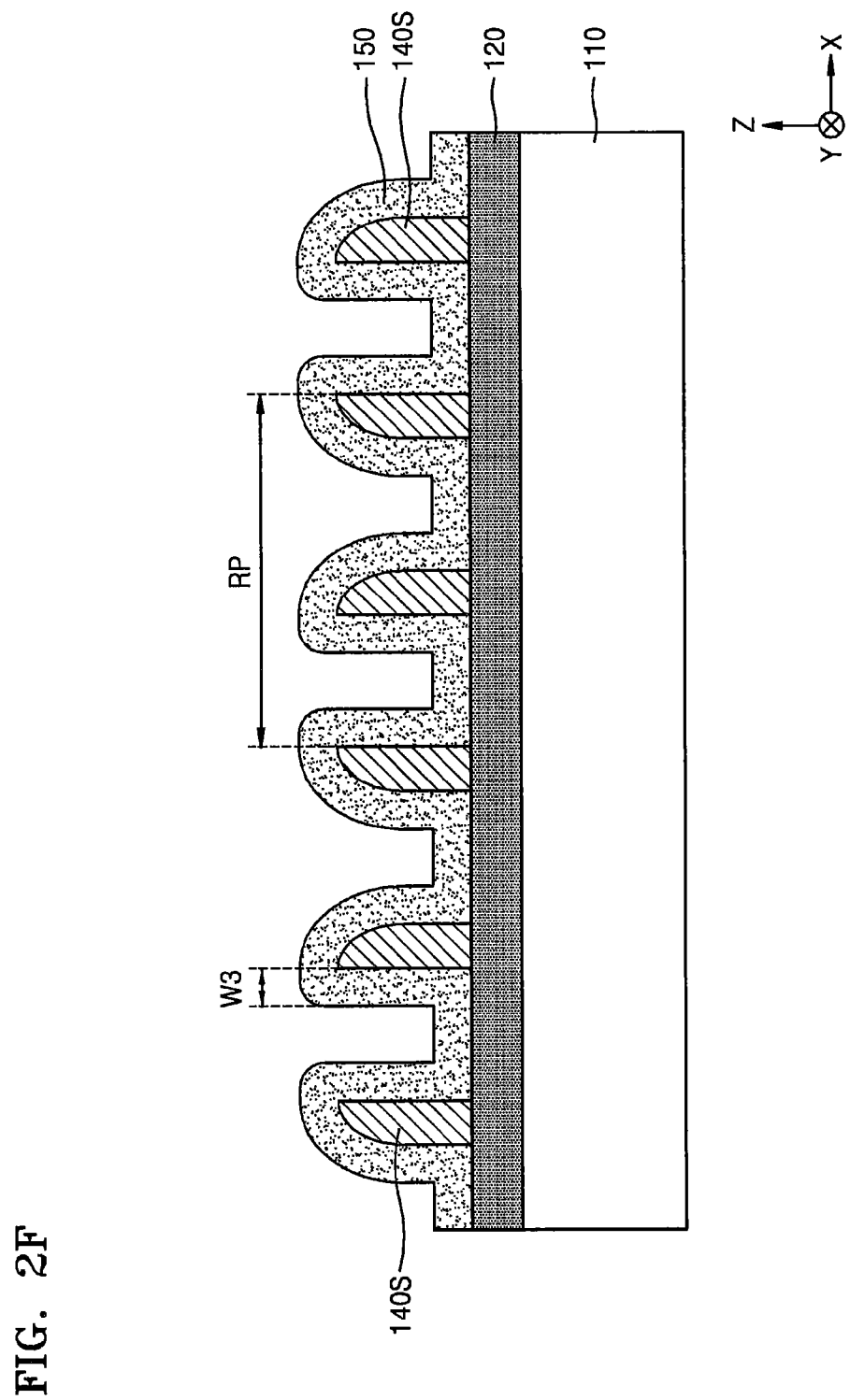
Figure 2G:
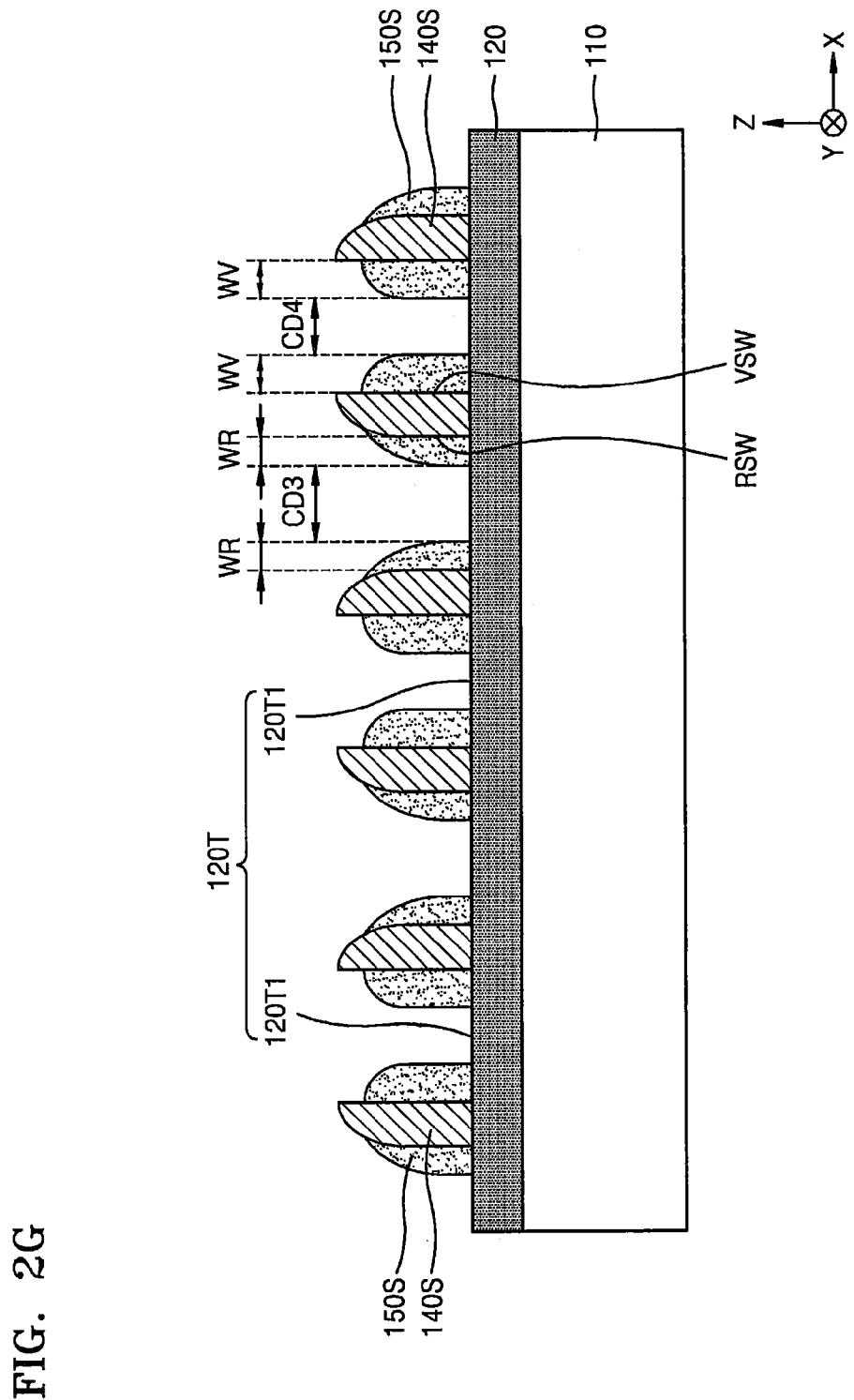

As a result, referring to FIGS. 1, 2F, and 2G, in process P50, the plurality of second spacers 150S covering both side walls of each of the plurality of first spacers 140S are formed.

To form the plurality of second spacers 150S, a second spacer forming liner 150 covers exposed surfaces of the plurality of second spacers 150S and the exposed surface 120T of the feature layer 120 at a uniform thickness as shown in FIG. 2F.

The second spacer forming liner 150 may be formed of a material having a sufficient etch selectivity with respect to the feature layer 120, the plurality of reference patterns 130, and the plurality of first spacers 140S. In some embodiments, the plurality of second spacers 150S may be formed as silicon oxide films, but are not limited thereto.

A width W3 of the second spacer forming liner 150 that covers both side walls of each of the plurality of first spacers 140S in the first direction (X direction) may be determined in consideration of various process variations that may occur in a process of forming the second spacer forming liner 150.

The width W3 of the second spacer forming liner 150 in the first direction (X direction) may be determined in consideration of a process variation in the operation of forming the plurality of second spacers 150S that will be described with reference to FIGS. 3A and 3B. In some embodiments, when a minimum feature size in the first direction (X direction) is 1 F, and the reference pitch RP is 8 F, the width W3 of the second spacer forming liner 150 that covers both side walls of each of the plurality of first spacers 140S in the first direction (X direction) may be set smaller than 1 F in consideration of the process variation in the operation of forming the plurality of second spacers 150S. In some other embodiments, when the reference pitch RP is 1 F, and the reference pitch RP is 8 F, the width W3 of the second spacer forming liner 150 may be set as 1 F in consideration of the process variation in the operation of forming the plurality of second spacers 150S. In some other embodiments, when the reference pitch RP is 1 F, and the reference pitch RP is 8 F, the width W3 of the second spacer forming liner 150 may be set greater than 1 F in consideration of the process variation in the operation of forming the plurality of second spacers 150S.

Figure 3A:
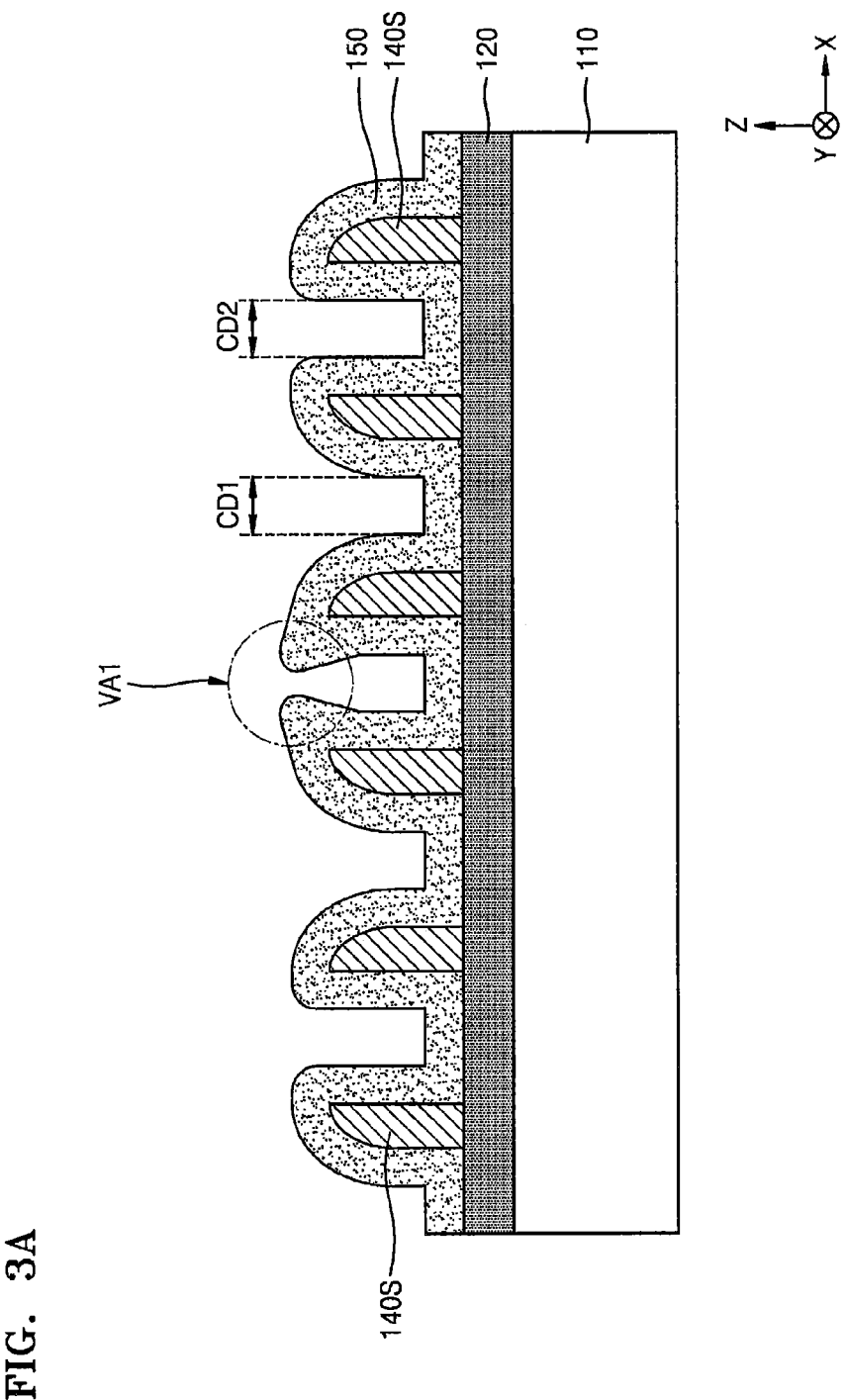
FIGS. 3A and 3B are cross-sectional views showing examples of a process variation that may occur in a method of manufacturing a semiconductor device, according to embodiments of the inventive concept.

FIG. 3A is a cross-sectional view showing examples of a process variation that may occur when forming the second spacer forming liner 150.

Like a region VA1 of FIG. 3A, as a pattern that is to be implemented becomes micro-sized, because spaces between the plurality of first spacers 140S narrow, an overhang phenomenon, in which a deposition amount of a material for forming the second spacer forming liner 150 deposited on upper portions of the plurality of first spacers 140S after forming the second spacer forming liner 150 on the plurality of first spacers 140S is larger than a deposition amount in lower regions of the plurality of first spacers 140S, may occur.

Alternatively, a critical dimension (CD) variation, whereby a CD of spaces provided in a region CD1 or CD2 indicated with a bidirectional arrow in a first direction (X direction) has different sizes according to locations on the substrate 110 between the plurality of first spacers 140S of FIG. 3A, may occur.

In some embodiments, during the process of forming the second space forming liner 150 described with reference to FIG. 2F above, a width of the second spacer forming liner 150 may be determined such that a space for preventing the overhang phenomenon may be secured between the plurality of first spacers 140S.

In some other embodiments, during the process of forming the second space forming liner 150 described with reference to FIG. 2F above, the width of the second spacer forming liner 150 may be determined such that a CD variation of spaces provided between the plurality of first spacers 140S in the first direction (X direction) may be reduced or minimized.

Thereafter, the plurality of second spacers 150S that is a remaining part of the second spacer forming liner 150 may remain on both side walls of each of the plurality of first spacers 140S by etching back the second space forming liner 150 such that a top surface of each of the plurality of first spacers 140S and a first surface 120T1 of the top surface 120T of the feature layer 120 may be exposed as shown in FIG. 2G.

Figure 3B:
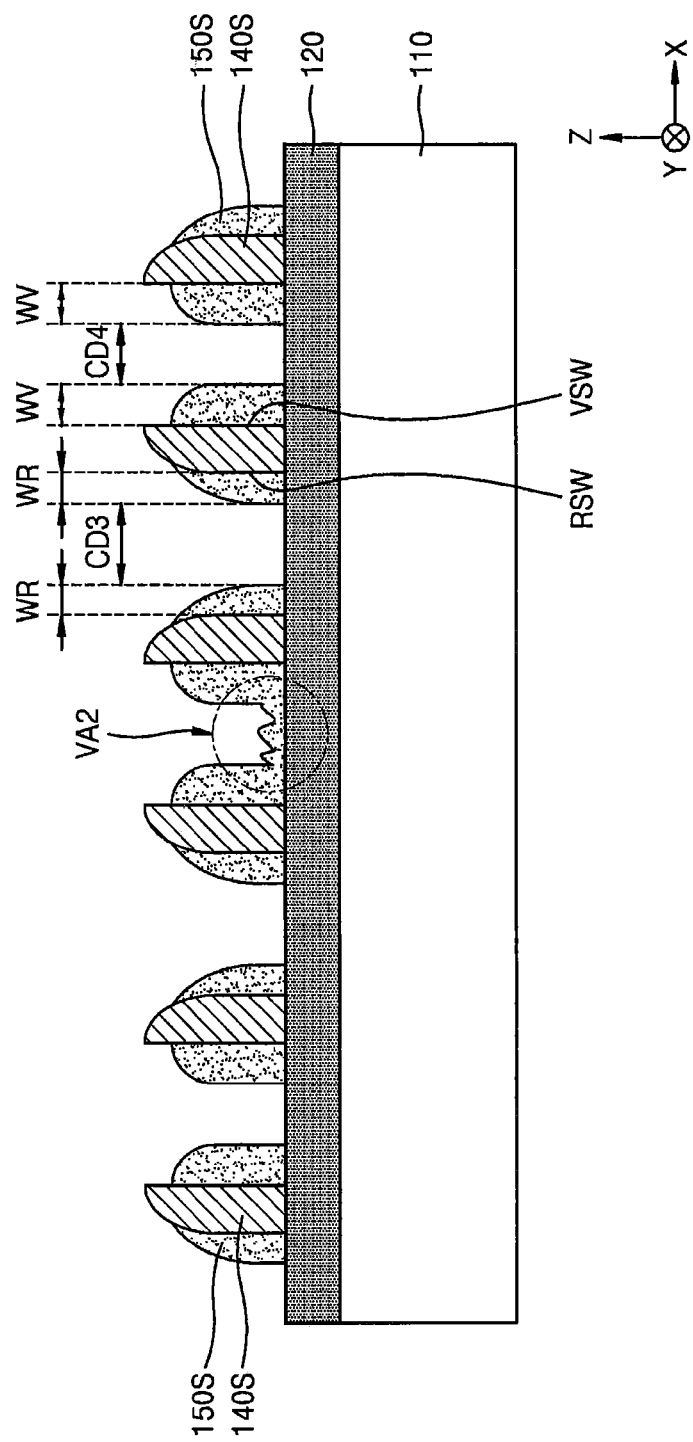

FIG. 3B is a cross-sectional view showing examples of a process variation that may occur when forming the plurality of second spacers 150S (FIG. 2G) from the second space forming liner 150 (FIG. 2F).

As a pattern that is to be implemented on the substrate 110 becomes micro-sized, because spaces between the plurality of first spacers 140S narrow, a phenomenon (hereinafter referred to as an "unetch phenomenon"), whereby a part of the second spacer forming liner 150 that needs to be removed is not etched but remains, like a region VA2 of FIG. 3B, in a partial region during etching back of the second spacer forming liner 150 on the plurality of first spacers 140S, may occur. The unetch phenomenon may be caused by, for example, the overhang phenomenon as described above with respect to the region VA1 of FIG. 3A.

In some embodiments, to prevent the unetch phenomenon as described with reference to FIG. 3A, the width W1 of the reference patterns 130 may be adjusted during the process of forming the reference patterns 130 described with reference to process P20 of FIG. 1 and FIG. 2B, the width W2 of the plurality of first spacers 140S may be adjusted during the process of forming the plurality of first spacers 140S described with reference to FIGS. 2C and 2D, or the width W3 of the second spacer forming liner 150 may be adjusted during the process of forming the second spacer forming liner 150 described with reference to process P50 of FIG. 1 and FIG. 2F.

In some embodiments, when a minimum feature size in a first direction (X direction) is 1 F, a reference feature described with reference to FIG. 2B may be set as 8 F, the width W1 of the reference patterns 130 may be formed greater than 3 F, the width W2 of the plurality of first spacers 140S described with reference to FIG. 2D may be formed as 1 F, and the width W3 of the second spacer forming liner 150 may described with reference to FIG. 2F may be formed smaller than 1 F.

In some other embodiments, a CD variation, in which a CD of spaces provided in a region having a width CD3 or CD4 indicated with a bidirectional arrow in the first direction (X direction) varies between the plurality of first spacers 140S of FIG. 3B according to locations on the substrate 110 or a local environment may occur. For example, the CD variation may be caused by a vertical cross-sectional shape of each of the plurality of first spacers 140S. Among both side walls of the plurality of first spacers 140S, for example, side walls formed to face side walls of the reference patterns 130 of FIG. 2D, are formed as side walls (hereinafter referred to as "vertical side walls") VSW extending in an approximately vertical direction (Z direction) with respect to an extension direction of the substrate 110 (for example, an extension direction of an X-Y plane), whereas, among both side walls of the plurality of first spacers 140S, side walls of an opposite side to a side facing the reference patterns 130 may be obtained as approximately round shape side walls (hereinafter referred to as "round side walls") RSW gradually away from the reference patterns 130 from upper portions to lower portions. Accordingly, the plurality of first spacers 140S of which both side walls are asymmetrical shapes may be formed, and, in upper spaces among the spaces between the plurality of first spacers 140S, a width between the two neighboring round side walls RSW may be greater than a width between the two neighboring vertical side walls VSW.

When the plurality of second spacers 150S are formed by forming and etching back the second spacer forming liner 150 on both side walls of each of the plurality of first spacers 140S of which both side walls are asymmetrical by using the method described with reference to FIGS. 2F and 2G, an etch amount of the second spacer forming liner 150 etched through the space between the two neighboring round side walls RSW among the spaces between the plurality of first spacers 140S may be greater than an etch amount of the second spacer forming liner 150 etched through the space between the neighboring two vertical side walls VSW. As a result, as shown in FIGS. 2G and 3B, a width WR of the two second spacers 150S in the first direction (X direction) remaining in the space between the neighboring two round side walls RSW among the plurality of second spacers 150S may be smaller than a width WV of the two second spacers 150S in the first direction (X direction) remaining in the space between the neighboring two vertical side walls VSW among the plurality of second spacers 150S.

In some embodiments, as shown in FIGS. 2G and 3B, because the width WR of the two second spacers 150S formed between the neighboring two round side walls RSW among the plurality of second spacers 150S is smaller than the width WV of the two second spacers 150S formed between the neighboring two vertical side walls VSW, the width CD3 of a space formed between the two second spacers 150S formed between the neighboring two round side walls RSW may be greater than the width CD4 of a space formed between the two second spacers 150S formed between the neighboring two vertical side walls VSW.

In some other embodiments, during the process of forming the reference patterns 130 described with reference to FIG. 2B, when a feature size is 1 F, and the reference pitch RP is 8 F, the width W1 of the reference patterns 130 may be formed greater than 3 F. Because the width W1 of the reference patterns 130 is formed greater than 3 F, when the width WV of the two second spacers 150S formed between the neighboring two vertical side walls VSW among the plurality of second spacers 150S is greater than the width WR of the two second spacers 150S formed between the neighboring two round side walls RSW among the plurality of second spacers 150S, the width CD3 of the space formed between the two second spacers 150S formed between the neighboring two round side walls RSW and the width CD4 of the space formed between the two second spacers 150S formed between the neighboring two vertical side walls VSW may be the same or similar.

In some embodiments, when a minimum feature size is 1 F, and the reference pitch RP is 8 F, during the process of forming the plurality of second spacers 150S described with reference to FIG. 2G, the widths WR and WV of the plurality of second spacers 150S in the first direction (X direction) may be set smaller than 1 F. In some other embodiments, at least one of the widths WR and WV of the plurality of second spacers 150S in the first direction (X direction) may be set as 1 F. In some other embodiments, the widths WR and WV of the plurality of second spacers 150S in the first direction (X direction) may be set greater than 1 F.

Figure 2H:
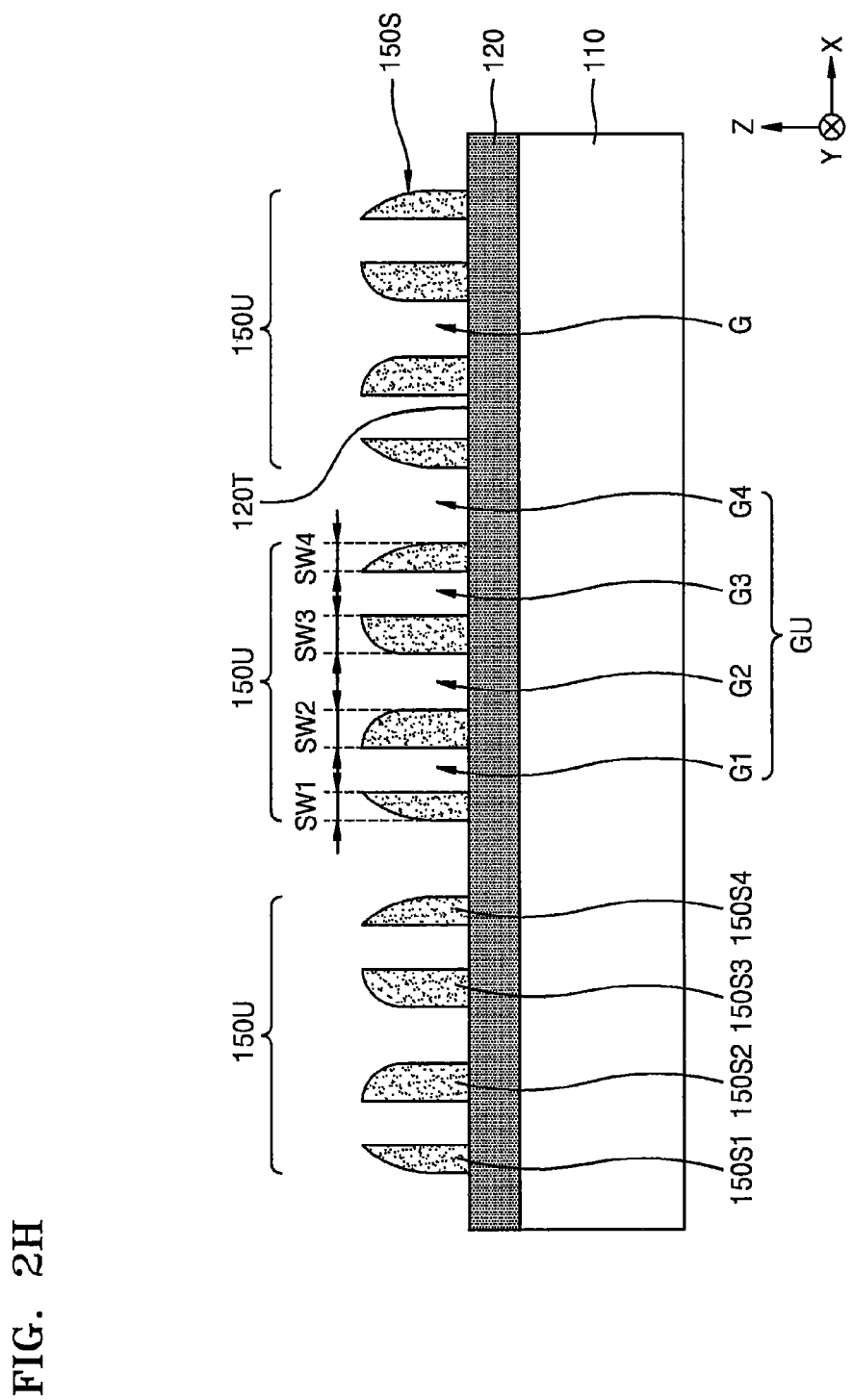

Referring to FIGS. 1 and 2H, in process P60, the plurality of first spacers 140S (see FIG. 2G) are removed.

As a result, a part of the top surface 120T of the feature layer 120 that is covered with the plurality of first spacers 150S may be exposed.

The plurality of second spacers 150S remaining on the feature layer 120 include a plurality of second spacer repetition units 150U having four second spacers 150S1, 150S2, 150S3, and 150S4 induced from the one reference pattern 130 among the plurality of reference patterns 130 formed in process P10 of FIG. 1 and the process of FIG. 2B as the one second spacer repetition unit 150U.

The four second spacers 150S1, 150S2, 150S3, and 150S4 constituting the one second spacer repetition unit 150U may be continuously arranged in the first direction (X direction) and have variable widths according to locations.

In some embodiments, as shown in FIG. 2H, the four second spacers 150S1, 150S2, 150S3, and 150S4 constituting the one second spacer repetition unit 150U may have a structure in which the first second spacer 150S1 having a relatively small width, the second spacer 150S2 having a relatively large width, the third second spacer 150S3 having a relatively large width, and the fourth second spacer 150S4 having a relatively small width are sequentially arranged in the first direction (X direction). In some embodiments, widths SW1 and SW2 of the first and fourth second spacers 150S1 and 150S4 among the four second spacers 150S1, 150S2, 150S3, and 150S4 constituting the one second spacer repetition unit 150U may be smaller than widths SW2 and SW3 of the second and third second spacers 150S2 and 150S3. The widths SW1 and SW2 of the first and fourth second spacers 150S1 and 150S4 may be the same, and the widths SW2 and SW3 of the second and third second spacers 150S2 and 150S3 may be the same.

As shown in FIG. 2H, a plurality of gaps G may be formed in the first direction (X direction) between the plurality of second spacers 150S. The plurality of gaps G may be formed in the first direction (X direction) between the plurality of second spacers 150S. The plurality of gaps G may include a plurality of continuously arranged gap repetition units GU having four gaps G1, G2, G3, and G4 continuously arranged in the first direction (X direction) and having variable widths according to locations as one gap repetition unit GU. The four gaps G1, G2, G3, and G4 constituting the one gap repetition unit GU may include the first gap G1 having a relatively small width, the second gap G2 having a relatively large width, the third gap G3 having a relatively small width, and the fourth gap G4 having a relatively large width. In some embodiments, widths of the first gap G1 and the third gap G3 among the four gaps G1, G2, G3, and G4 constituting the one gap repetition unit GU may be smaller than widths of the second gap G2 and the fourth gap G4. The widths of the first gap G1 and the third gap G3 may be the same. The widths of the second gap G2 and the fourth gap G4 may be the same.

A resultant structure of FIG. 2H as described above is merely one example that is selectable from various embodiments according to the inventive concept. Various repetition units may be arranged differently from the example of FIG. 2H, within the scope of the inventive concept.

Figure 2I:
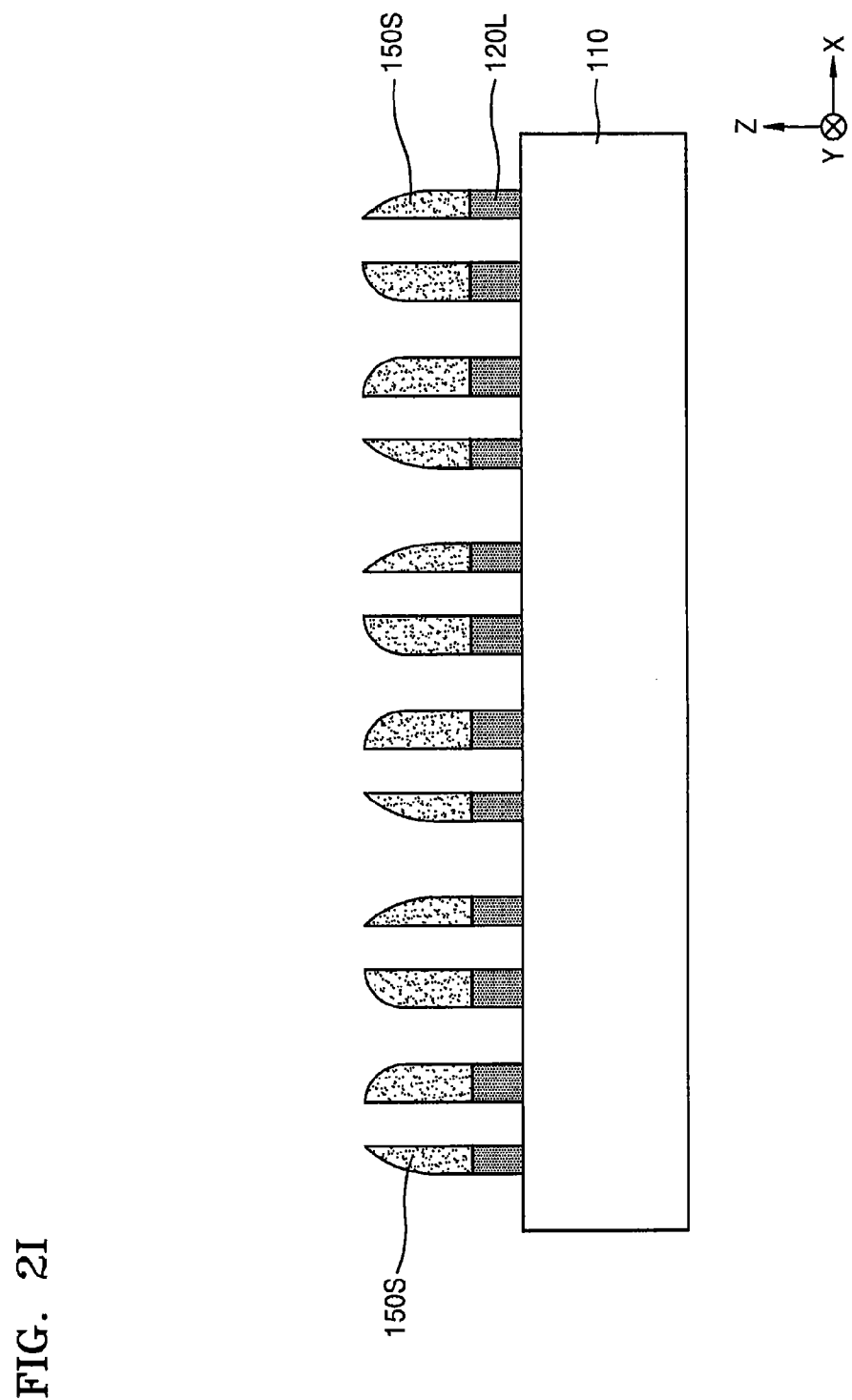

Referring to FIGS. 1 and 2I, in process P70, the plurality of line patterns 120L are formed by etching the feature layer 120 by using the plurality of second spacers 150S as an etch mask.

The plurality of line patterns 120L may include a plurality of continuous line repetition units 120U having, as one line repetition unit 120U, four line patterns 120L1, 120L2, 120L3, and 120L4 continuously arranged in the first direction (X direction) and having variable widths according to locations. The plurality of line repetition units 120U may have the same width.

Figure 2J:
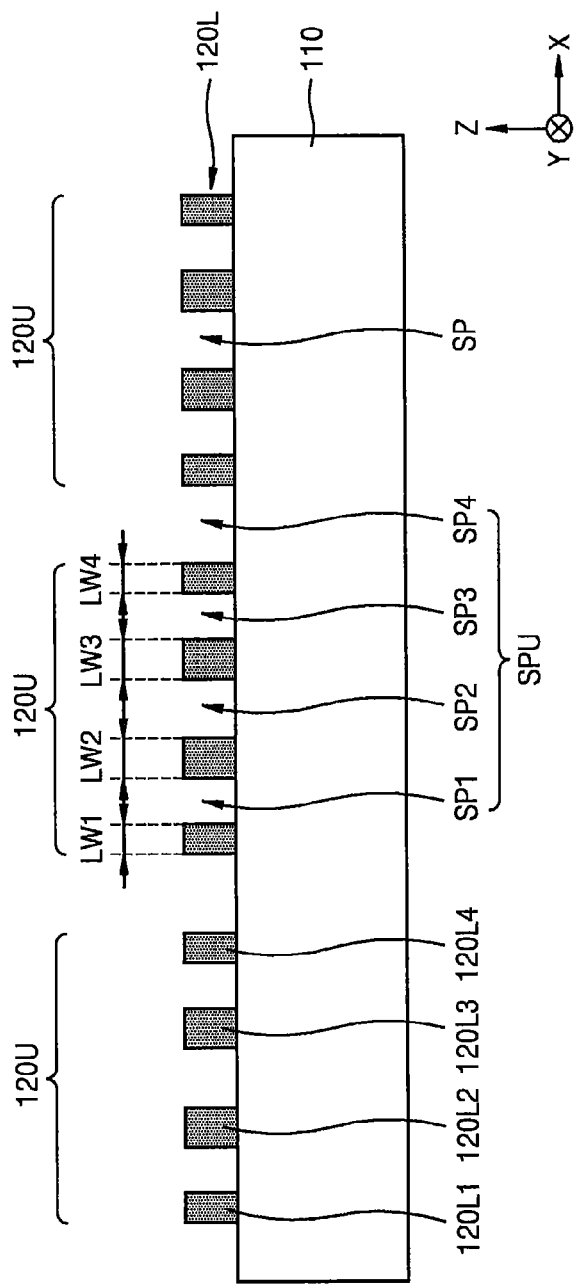

Referring to FIG. 2J, the plurality of second spacers 150S (see FIG. 2I) remaining on the plurality of line patterns 120L may be removed according to necessity.

In some embodiments, as in the structure of FIG. 2J, the four line patterns 120L1, 120L2, 120L3, and 120L4 constituting the one line repetition unit 120U may have a structure in which the first line pattern 120L1 having a relatively small width, the second line pattern 120L2 having a relatively large width, the third line pattern 120L3 having a relatively large width, and the fourth line pattern 120L4 having a relatively small width are sequentially arranged in the first direction (X direction). In some embodiments, widths LW1 and LW4 of the first line pattern 120L1 and the fourth line pattern 120L4 among the four line patterns 120L1, 120L2, 120L3, and 120L4 constituting the one line repetition unit 120U may be smaller than widths LW2 and LW3 of the second line pattern 120L2 and the third line pattern 120L3. The widths LW1 and LW4 of the first line pattern 120L1 and the fourth line pattern 120L4 may be the same. The widths LW2 and LW3 of the second line pattern 120L2 and the third line pattern 120L3 may be the same.

As shown in FIG. 2J, a plurality of spaces SP are arranged between the plurality of line patterns 120L. The plurality of spaces SP may include a plurality of continuously arranged space repetition units SPU having, as one space repetition unit SPU, four spaces SP1, SP2, SP3, and SP4 continuously arranged in the first direction (X direction) and having variable widths according to locations.

The four spaces SP1, SP2, SP3, and SP4 constituting the one space repetition unit SPU may include the first space SP1 having a relatively small width, the second space SP2 having a relatively large width, the third space SP3 having a relatively small width, and the fourth space SP4 having a relatively large width. In some embodiments, widths of the first space SP1 and the third space SP3 in the first direction (X direction) among the four spaces SP1, SP2, SP3, and SP4 constituting the one space repetition unit SPU may be smaller than widths of the second space SP2 and the fourth space SP4 in the first direction (X direction). The widths of the first space SP1 and the third space SP3 may be the same. The widths of the second space SP2 and the fourth space SP4 may be the same.

A resultant structure of FIG. 2J as described above is merely one example that is selectable from various embodiments according to the inventive concept. Various repetition units may be arranged differently from the example of FIG. 2J, within the scope of the inventive concept.

FIGS. 4 through 9C are diagrams illustrating a method of manufacturing a semiconductor device, according to various embodiments of the inventive concept. In more detail, FIGS. 4A, 5A, . . . , and 9A are diagrams illustrating operations of variously forming widths of the plurality of reference patterns 130, the plurality of first spacers 140S, and the plurality of second spacers 150S in the method of manufacturing a semiconductor device according to various embodiments of the inventive concept described with reference to FIGS. 2A through 2J. FIGS. 4B, 5B, . . . , 9B, and 9C are plan views of a plurality of line patterns obtainable by using the methods of FIGS. 4A, 5A, . . . , and 9A, respectively.

The same elements are denoted by the same reference numerals between FIGS. 4A through 9C and FIGS. 2A through 2J, and thus detailed descriptions thereof are omitted below. A case in which a minimum feature size of a semiconductor device that is to be formed is 1 F, and the reference pitch RP is 8 F will be described by way of example with reference to FIGS. 4 through 9C.

Figure 4A:
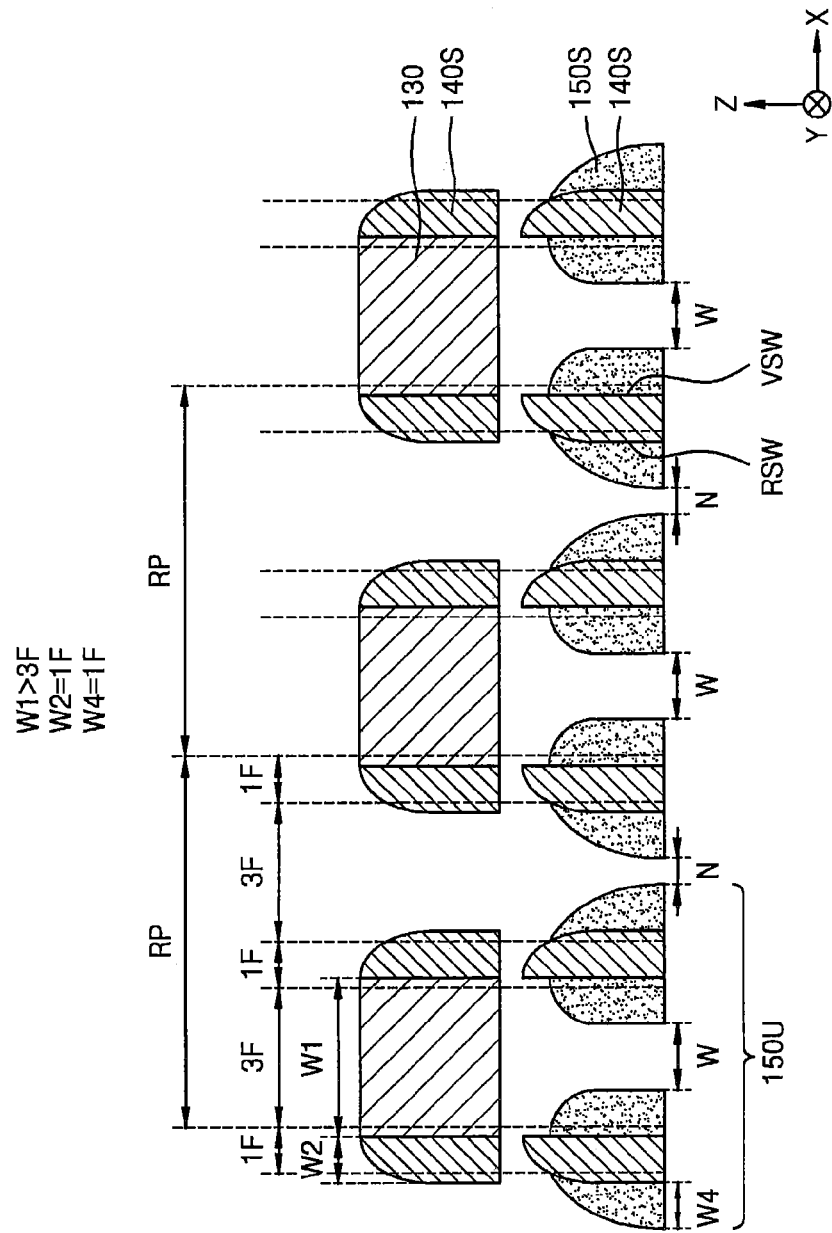
FIGS. 4A and 4B are diagrams illustrating a method of manufacturing a semiconductor device and line patterns having various layout structures according to embodiments of the inventive concept.

Referring to FIG. 4A, a method of manufacturing the semiconductor device according to various embodiments of the inventive concept may comprise forming the plurality of reference patterns 130 having a width W1 greater than 3 F, the plurality of first spacers 140S having a width W2 of 1 F, and the plurality of second spacers 150S having a width W4 of 1 F.

Among the plurality of second spacers 150S formed by using the method of FIG. 4A, the four second spacers 150S constituting the one second spacer repetition unit 150U may have a same width of 1 F. A gap having a relatively small width N, for example, the width N smaller than 1 F, may be formed between the two second spacers 150S in a space between the neighboring two round side walls RSW among spaces between the plurality of first spacers 140S. A gap having a relatively large width W, for example, the width W greater than 1 F, may be formed between the two second spacers 150S in a space between the neighboring two vertical side walls VSW.

Figure 4B:
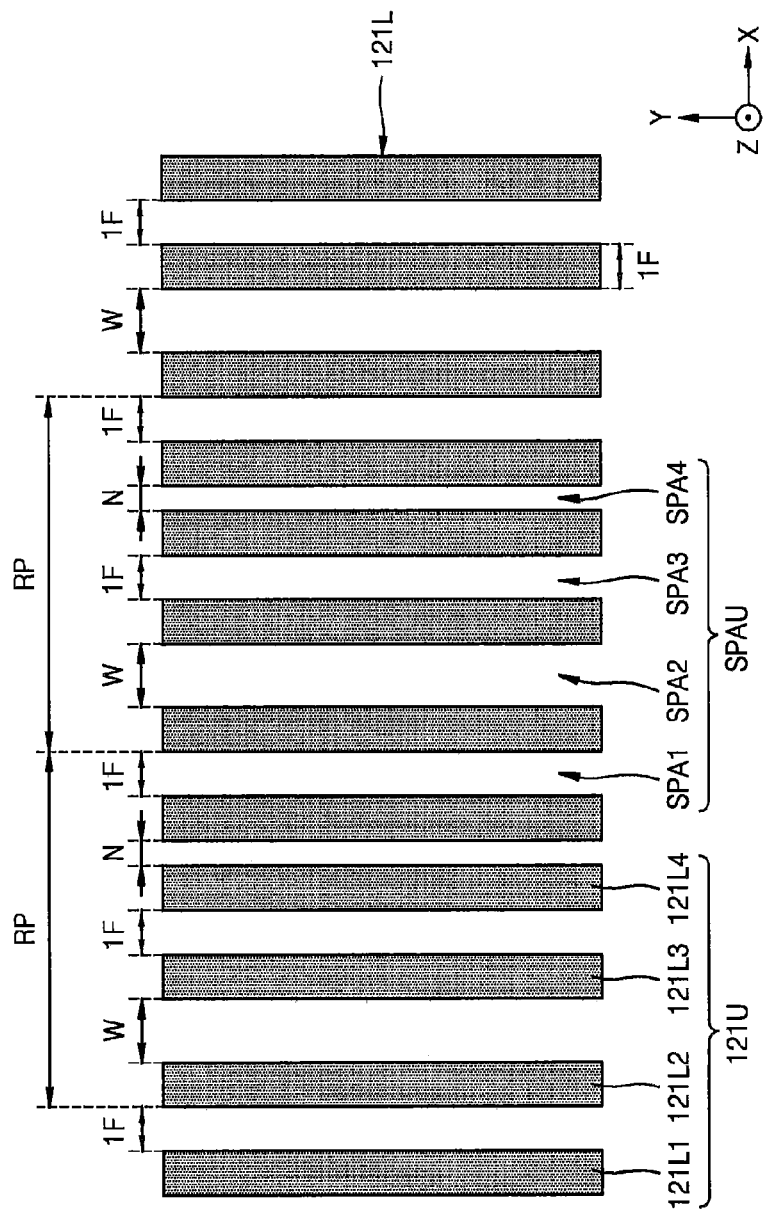

FIG. 4B illustrates a plurality of line patterns 121L that may be obtained when etching the feature layer 120 in a similar way as described with reference to FIG. 2I by using the plurality of second spacers 150S of FIG. 4A as an etch mask.

In the plurality of line patterns 121L of FIG. 4B, four line patterns 121L1, 121L2, 121L3, and 121L4 constituting one line repetition unit 121U may have a same width of 1 F in a first direction (X direction).

A plurality of continuously arranged space repetition units SPAU having, as one space repetition unit SPAU, four spaces SPA1, SPA2, SPA3, and SPA4 continuously arranged in the first direction (X direction) and having variable widths may be provided between the plurality of line patterns 121L of FIG. 4B. In the four spaces SPA1, SPA2, SPA3, and SPA4 constituting the one space repetition unit SPAU, the first space SPA1 and the third space SPA3 may have a same width of 1 F. The second space SPA2 may have a width W greater than 1 F. The fourth spacer SPA4 may have a width N smaller than 1 F.

Figure 5A:
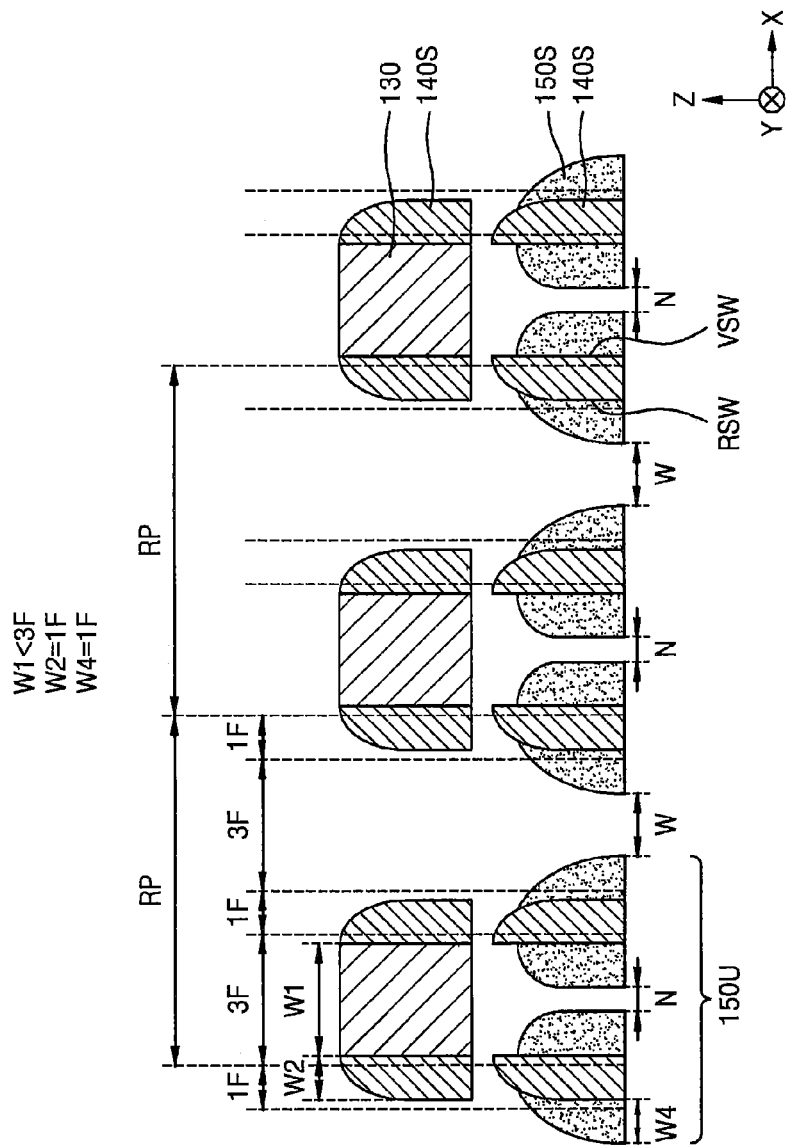
FIGS. 5A and 5B are diagrams illustrating a method of manufacturing a semiconductor device and line patterns having various layout structures according to further embodiments of the inventive concept.

Referring to FIG. 5A, a method of manufacturing the semiconductor device according to various embodiments of the inventive concept may comprise forming the plurality of reference patterns 130 having a width W1 greater than 3 F, the plurality of first spacers 140S having a width W2 of 1 F, and the plurality of second spacers 150S having a width W4 of 1 F.

Among the plurality of second spacers 150S formed by using the method of FIG. 5A, the four second spacers 150S constituting the one second spacer repetition unit 150U may have a same width of 1 F. A gap having a relatively large width W, for example, the width W greater than 1 F, may be formed between the two second spacers 150S in a space between the neighboring two round side walls RSW among spaces between the plurality of first spacers 140S. A gap having a relatively small width N, for example, the width N smaller than 1 F, may be formed between the two second spacers 150S in a space between the neighboring two vertical side walls VSW.

Figure 5B:
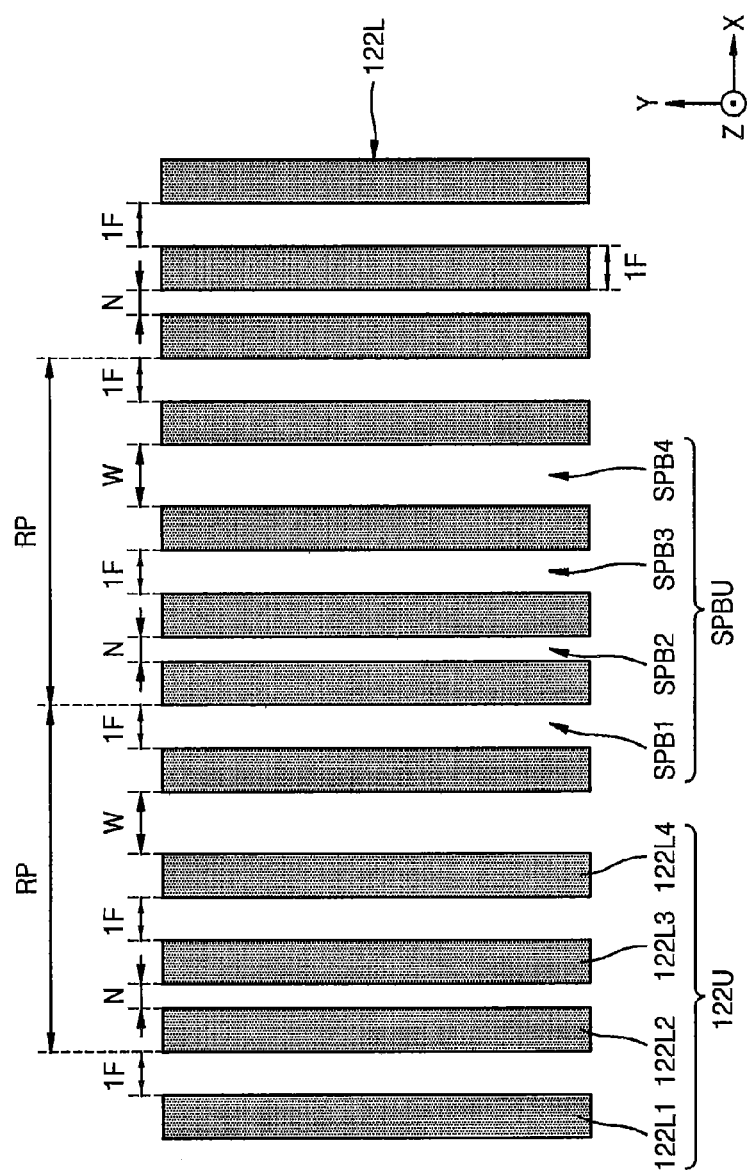

FIG. 5B illustrates a plurality of line patterns 122L that may be obtained when etching the feature layer 120 in a similar way as described with reference to FIG. 2I by using the plurality of second spacers 150S of FIG. 5A as an etch mask.

In the plurality of line patterns 122L of FIG. 5B, four line patterns 122L1, 122L2, 122L3, and 122L4 constituting one line repetition unit 122U may have a same width of 1 F in the first direction (X direction).

A plurality of continuously arranged space repetition units SPBU having, as one space repetition unit SPBU, four spaces SPB1, SPB2, SPB3, and SPB4 continuously arranged in the first direction (X direction) and having variable widths may be provided between the plurality of line patterns 122L of FIG. 5B. In the four spaces SPB1, SPB2, SPB3, and SPB4 constituting the one space repetition unit SPBU, the first space SPB1 and the third space SPB3 may have a same width of 1 F. The second space SPB2 may have a relatively small width N, for example, the width N smaller than 1 F. The fourth spacer SPB4 may have a relatively large width W, for example, the width W greater than 1 F.

Figure 6A:
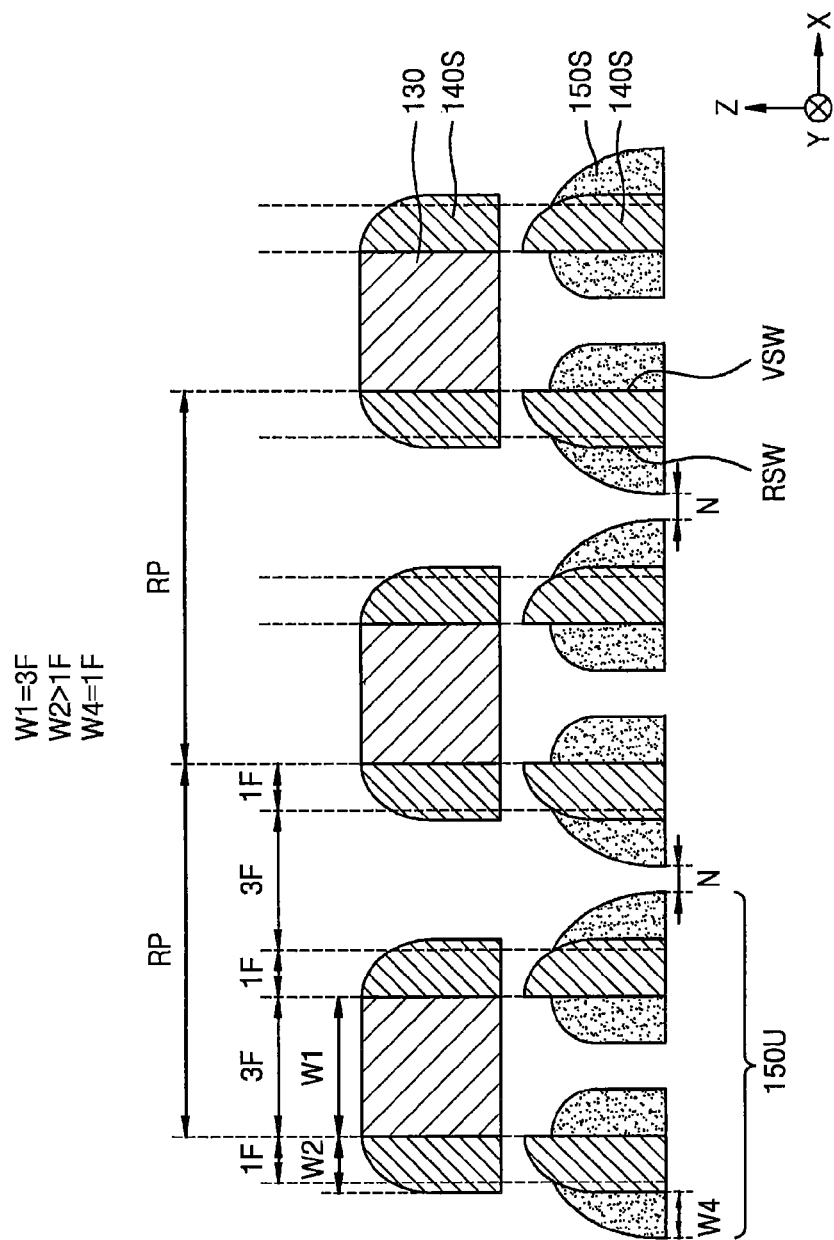
FIGS. 6A and 6B are diagrams illustrating a method of manufacturing a semiconductor device and line patterns having various layout structures according to further embodiments of the inventive concept.

Referring to FIG. 6A, a method of manufacturing the semiconductor device according to various embodiments of the inventive concept may comprise forming the plurality of reference patterns 130 having a width W1 greater than 3 F, the plurality of first spacers 140S having a width W2 of 1 F, and the plurality of second spacers 150S having a width W4 of 1 F.

Among the plurality of second spacers 150S formed by using the method of FIG. 6A, the four second spacers 150S constituting the one second spacer repetition unit 150U may have a same width of 1 F. A gap having a relatively small width N may be formed between the two second spacers 150S in a space between the neighboring two round side walls RSW among spaces between the plurality of first spacers 140S. A gap having a width of about 1 F may be formed between the two second spacers 150S in a space between the neighboring two vertical side walls VSW.

Figure 6B:
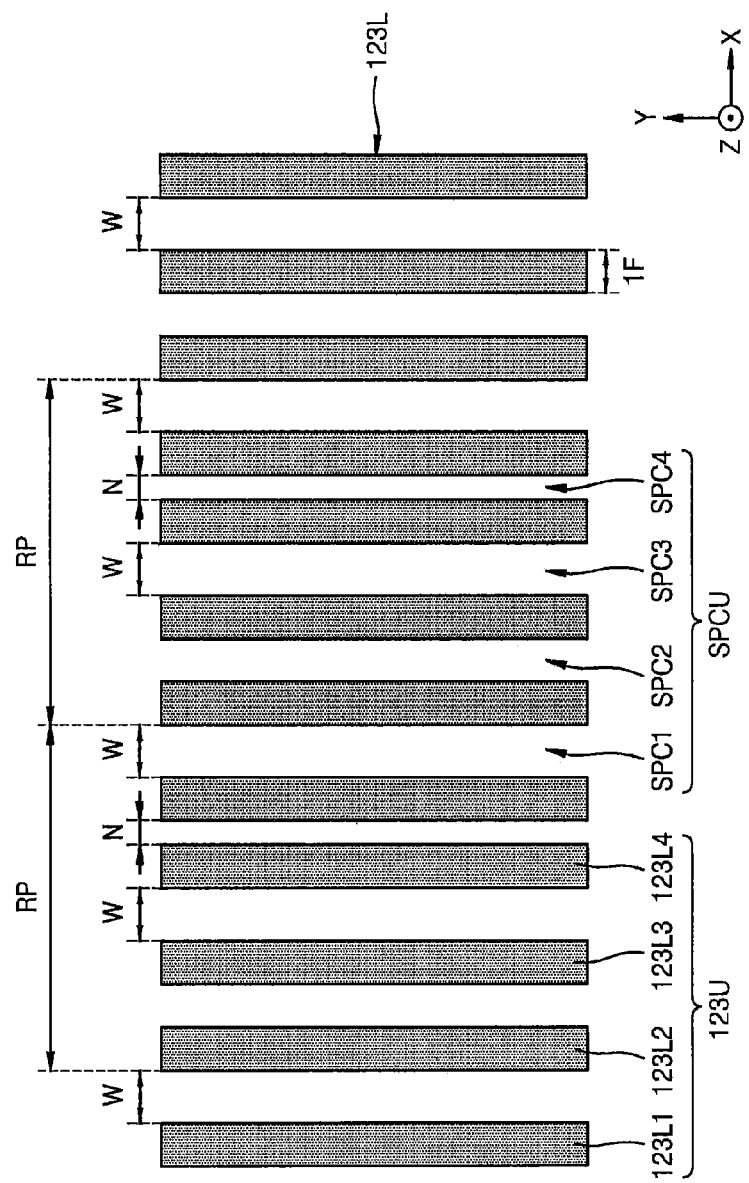

FIG. 6B illustrates a plurality of line patterns 123L that may be obtained when etching the feature layer 120 in a similar way as described with reference to FIG. 2I by using the plurality of second spacers 150S of FIG. 6A as an etch mask.

In the plurality of line patterns 121L of FIG. 4B, four line patterns 123L1, 123L2, 123L3, and 123L4 constituting one line repetition unit 123U may have a same width of 1 F in the first direction (X direction).

A plurality of continuously arranged space repetition units SPCU having, as one space repetition unit SPCU, four spaces SPC1, SPC2, SPC3, and SPC4 continuously arranged in the first direction (X direction) and having variable widths may be provided between the plurality of line patterns 123L of FIG. 6B. In the four spaces SPC1, SPC2, SPC3, and SPC4 constituting the one space repetition unit SPCU, the first space SPC1 and the third space SPC3 may have a relatively large width W, for example, the width W greater than 1 F. The second space SPC2 may have a width of 1 F. The fourth spacer SPC4 may have a relatively small width N, for example, the width N smaller than 1 F.

Figure 7A:
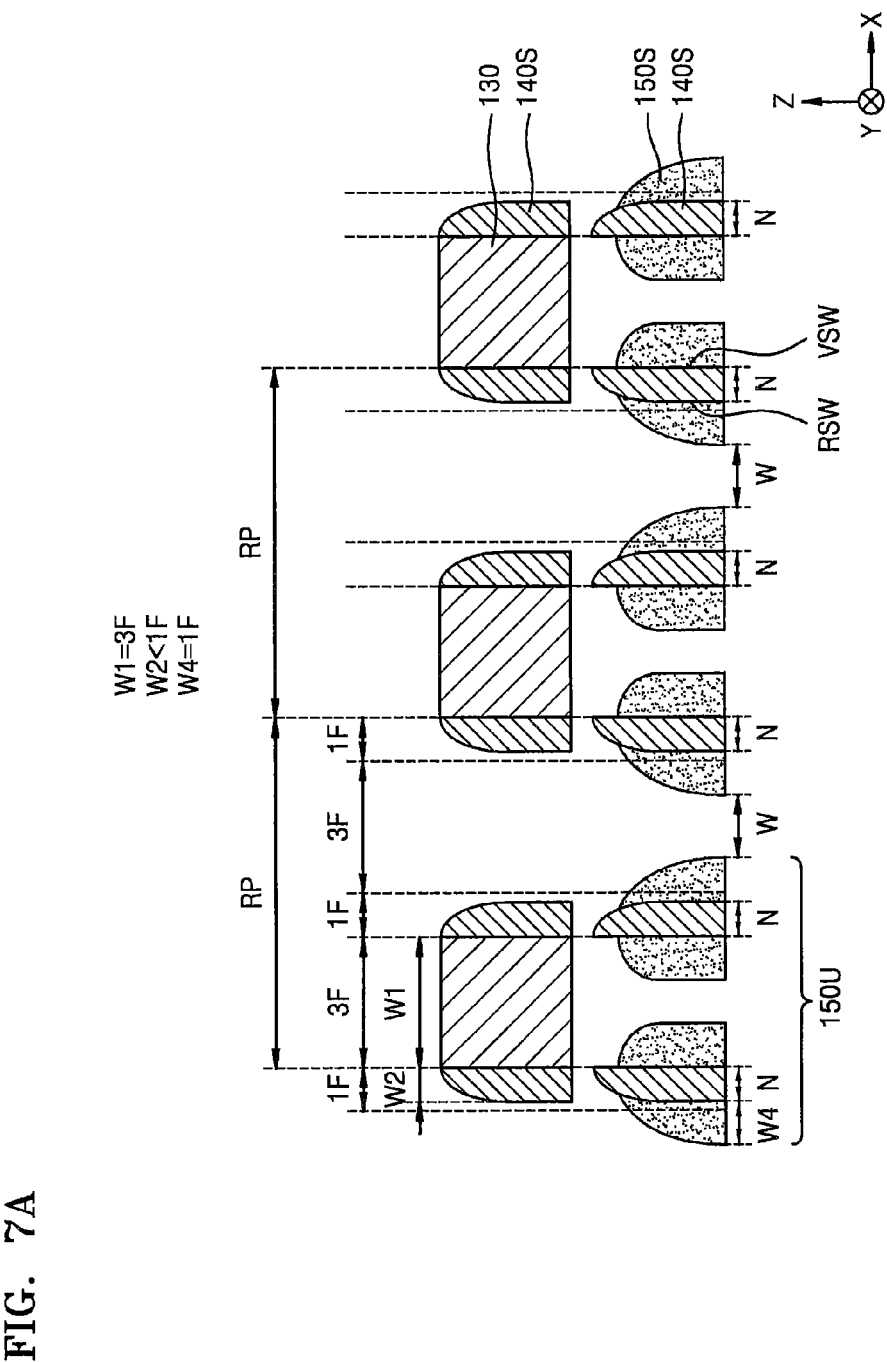
FIGS. 7A and 7B are diagrams illustrating a method of manufacturing a semiconductor device and line patterns having various layout structures according to further embodiments of the inventive concept.

Referring to FIG. 7A, a method of manufacturing the semiconductor device according to various embodiments of the inventive concept may comprise forming the plurality of reference patterns 130 having a width W1 greater than 3 F, the plurality of first spacers 140S having a width W2 of 1 F, and the plurality of second spacers 150S having a width W4 of 1 F.

Among the plurality of second spacers 150S formed by using the method of FIG. 7A, the four second spacers 150S constituting the one second spacer repetition unit 150U may have a same width of 1 F. A gap having a relatively large width W may be formed between the two second spacers 150S in a space between the neighboring two round side walls RSW among spaces between the plurality of first spacers 140S. A gap having a width W of about 1 F may be formed between the two second spacers 150S in a space between the neighboring two vertical side walls VSW.

Figure 7B:
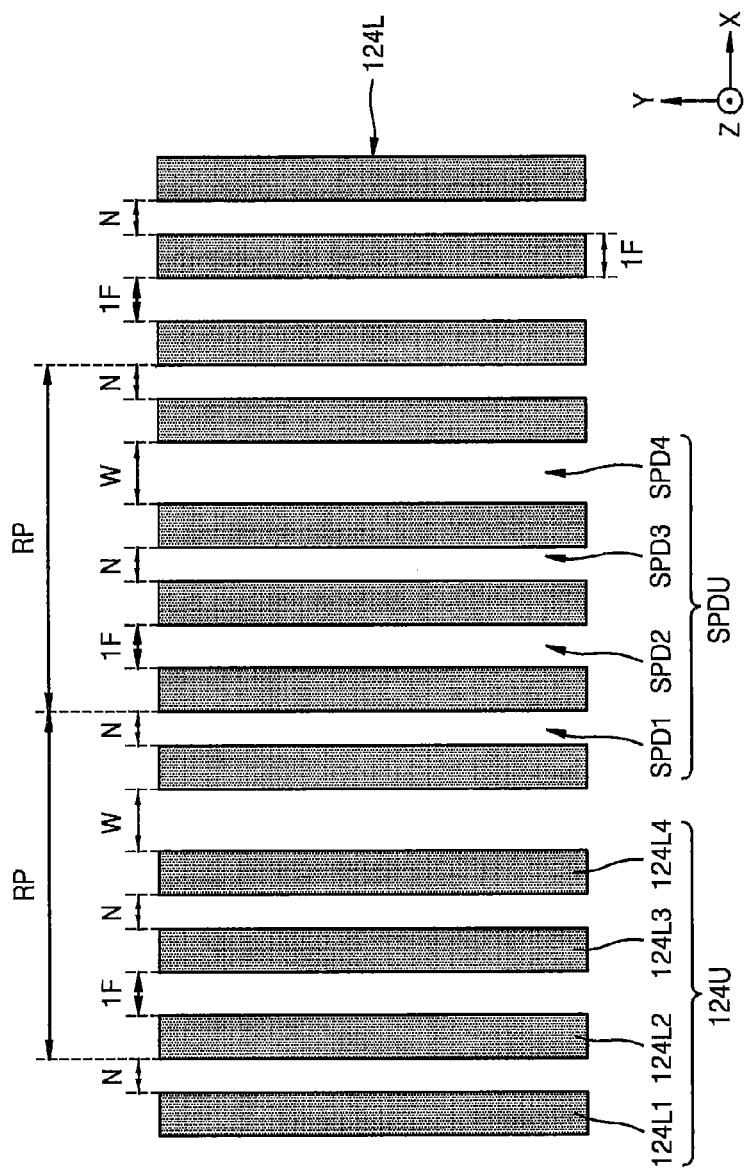

FIG. 7B illustrates a plurality of line patterns 124L that may be obtained when etching the feature layer 120 in a similar way as described with reference to FIG. 2I by using the plurality of second spacers 150S of FIG. 7A as an etch mask.

In the plurality of line patterns 124L of FIG. 7B, four line patterns 124L1, 124L2, 124L3, and 124L4 constituting one line repetition unit 124U may have a same width of 1 F in the first direction (X direction).

A plurality of continuously arranged space repetition units SPDU having, as one space repetition unit SPDU, four spaces SPD1, SPD2, SPD3, and SPD4 continuously arranged in the first direction (X direction) and having variable widths may be provided between the plurality of line patterns 124L of FIG. 7B. In the four spaces SPD1, SPD2, SPD3, and SPD4 constituting the one space repetition unit SPDU, the first space SPD1 and the third space SPD3 may have a relatively small width N, for example, the width N smaller than 1 F. The second space SPD2 may have a width of 1 F. The fourth spacer SPD4 may have a relatively large width W, for example, the width W greater than 1 F.

Figure 8A:
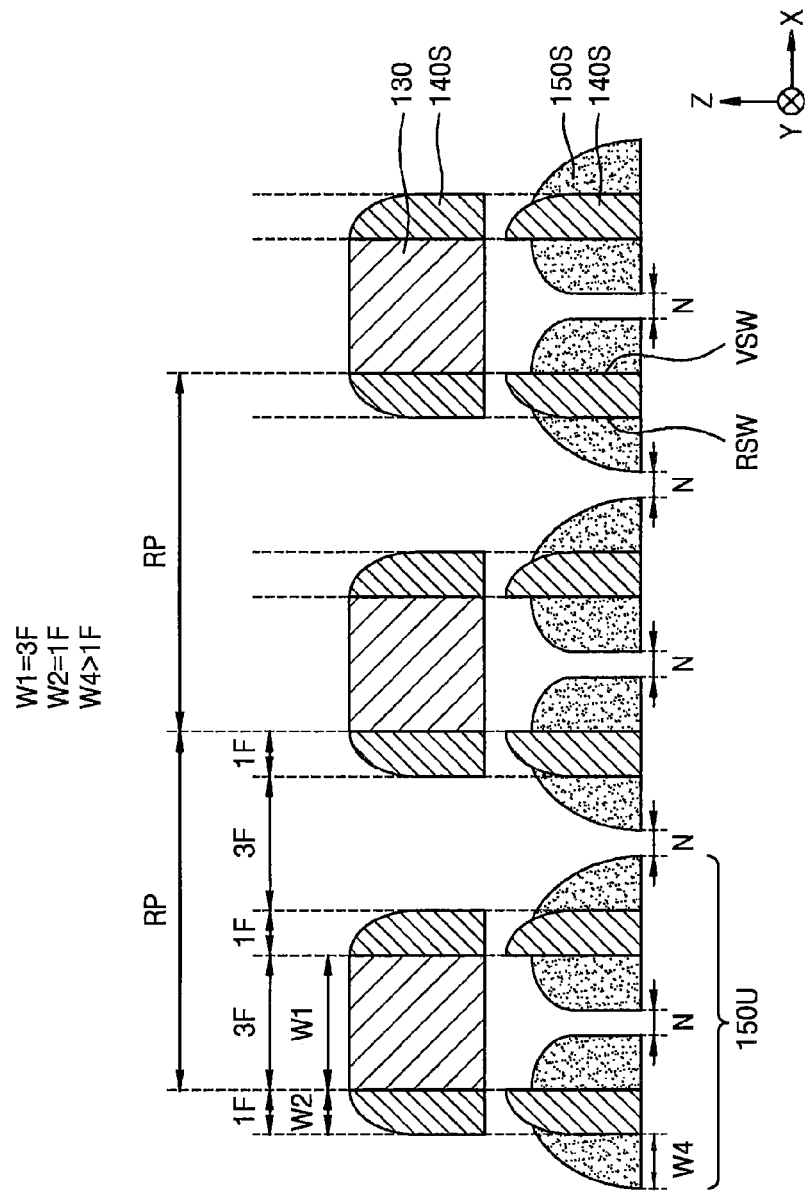
FIGS. 8A and 8B are diagrams illustrating a method of manufacturing a semiconductor device and line patterns having various layout structures according to further embodiments of the inventive concept.

Referring to FIG. 8A, a method of manufacturing the semiconductor device according to various embodiments of the inventive concept may comprise forming the plurality of reference patterns 130 having a width W1 greater than 3 F, the plurality of first spacers 140S having a width W2 of 1 F, and the plurality of second spacers 150S having a width W4 of 1 F.

Among the plurality of second spacers 150S formed by using the method of FIG. 8A, the four second spacers 150S constituting the one second spacer repetition unit 150U may have the same width W greater than 1 F. A gap having a relatively small width N smaller than 1 F may be formed between the two second spacers 150S in a space between the neighboring two round side walls RSW among spaces between the plurality of first spacers 140S and between the two second spacers 150S in a space between the neighboring two vertical side walls VSW.

Figure 8B:
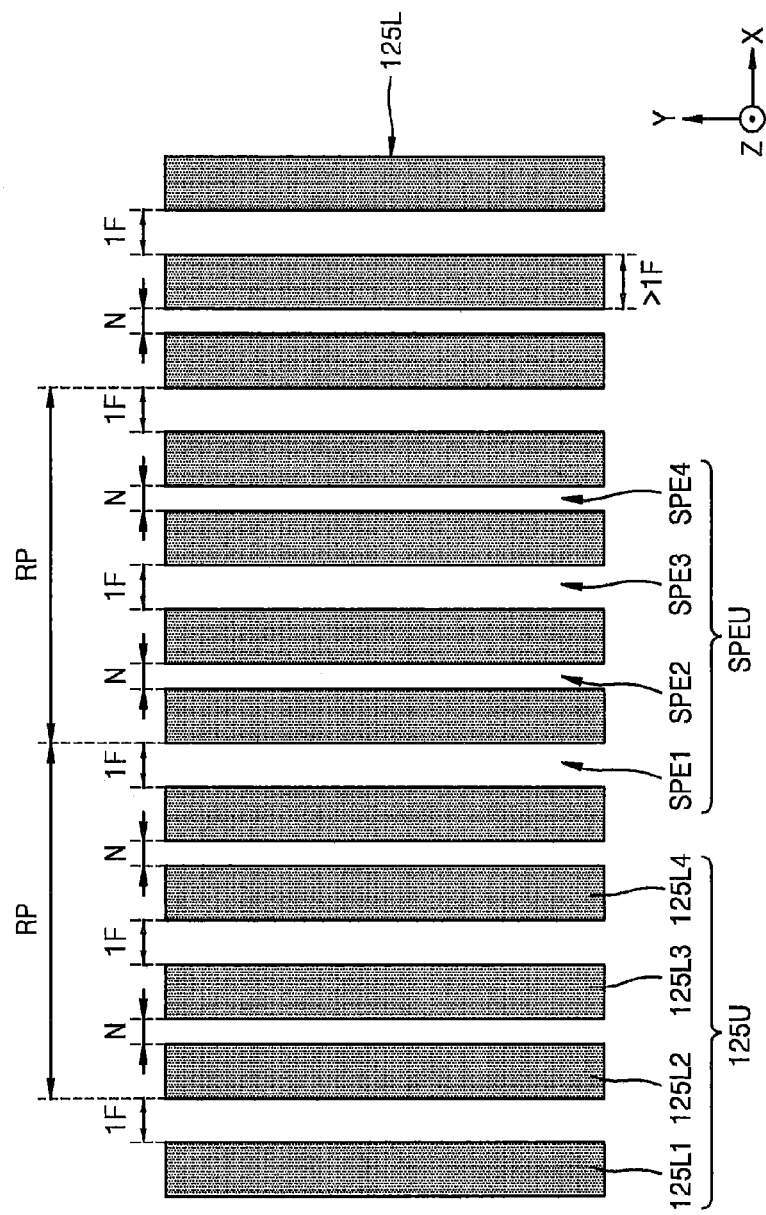

FIG. 8B illustrates a plurality of line patterns 125L that may be obtained when etching the feature layer 120 in a similar way as described with reference to FIG. 2I by using the plurality of second spacers 150S of FIG. 8A as an etch mask.

In the plurality of line patterns 125L of FIG. 8B, four line patterns 125L1, 125L2, 125L3, and 125L4 constituting one line repetition unit 125U may have a same width greater than 1 F in the first direction (X direction).

A plurality of continuously arranged space repetition units SPEU having, as one space repetition unit SPEU, four spaces SPE1, SPE2, SPE3, and SPE4 continuously arranged in the first direction (X direction) and having variable widths may be provided between the plurality of line patterns 125L of FIG. 8B. In the four spaces SPE1, SPE2, SPE3, and SPE4 constituting the one space repetition unit SPEU, the first space SPE1 and the third space SPE3 may have a same width N of 1 F. The second space SPE2 and the fourth space SPE4 may have a relatively small width N, for example, the width N smaller than 1 F.

Figure 9A:
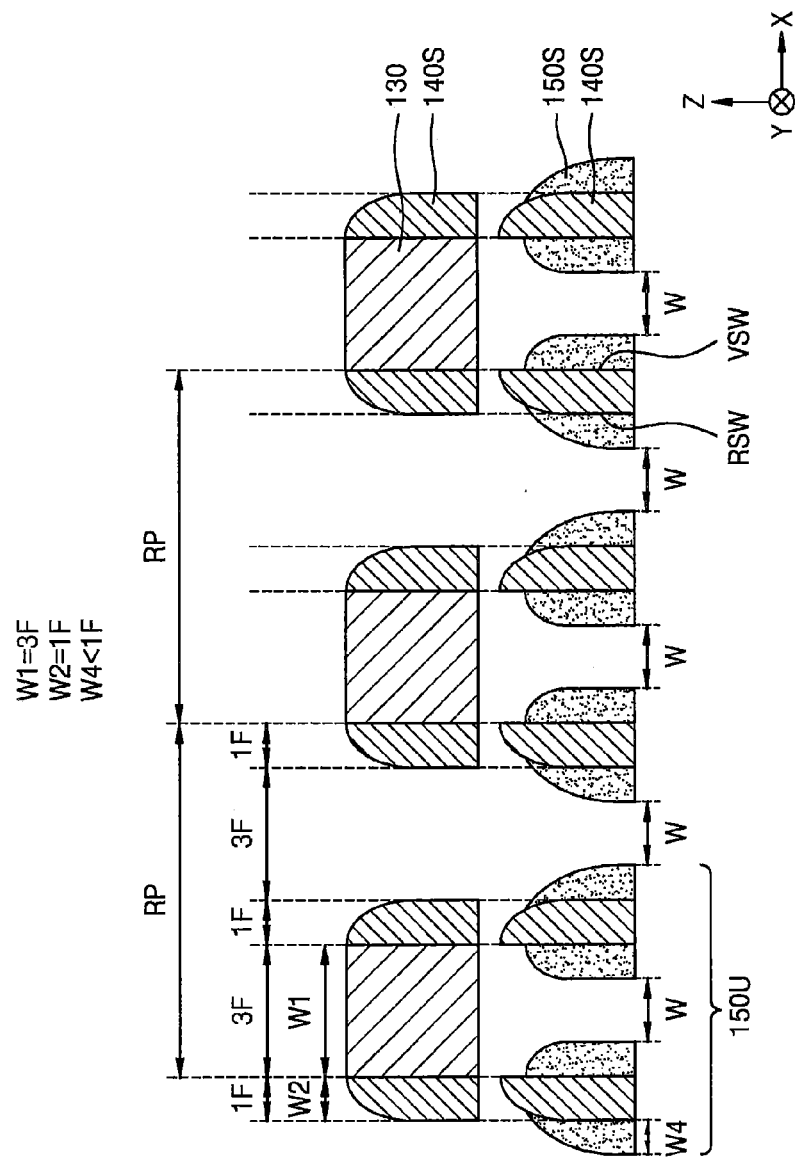
FIGS. 9A through 9C are diagrams illustrating a method of manufacturing a semiconductor device and line patterns having various layout structures according to further embodiments of the inventive concept.

Referring to FIG. 9A, a method of manufacturing the semiconductor device according to various embodiments of the inventive concept may comprise forming the plurality of reference patterns 130 having a width W1 greater than 3 F, the plurality of first spacers 140S having a width W2 of 1 F, and the plurality of second spacers 150S having a width W4 of 1 F.

Among the plurality of second spacers 150S formed by using the method of FIG. 9A, the four second spacers 150S constituting the one second spacer repetition unit 150U may have a same width smaller than 1 F. A gap having a relatively larger width W greater than 1 F may be formed between the two second spacers 150S in a space between the neighboring two round side walls RSW among spaces between the plurality of first spacers 140S and between the two second spacers 150S in a space between the neighboring two vertical side walls VSW.

Figure 9B:
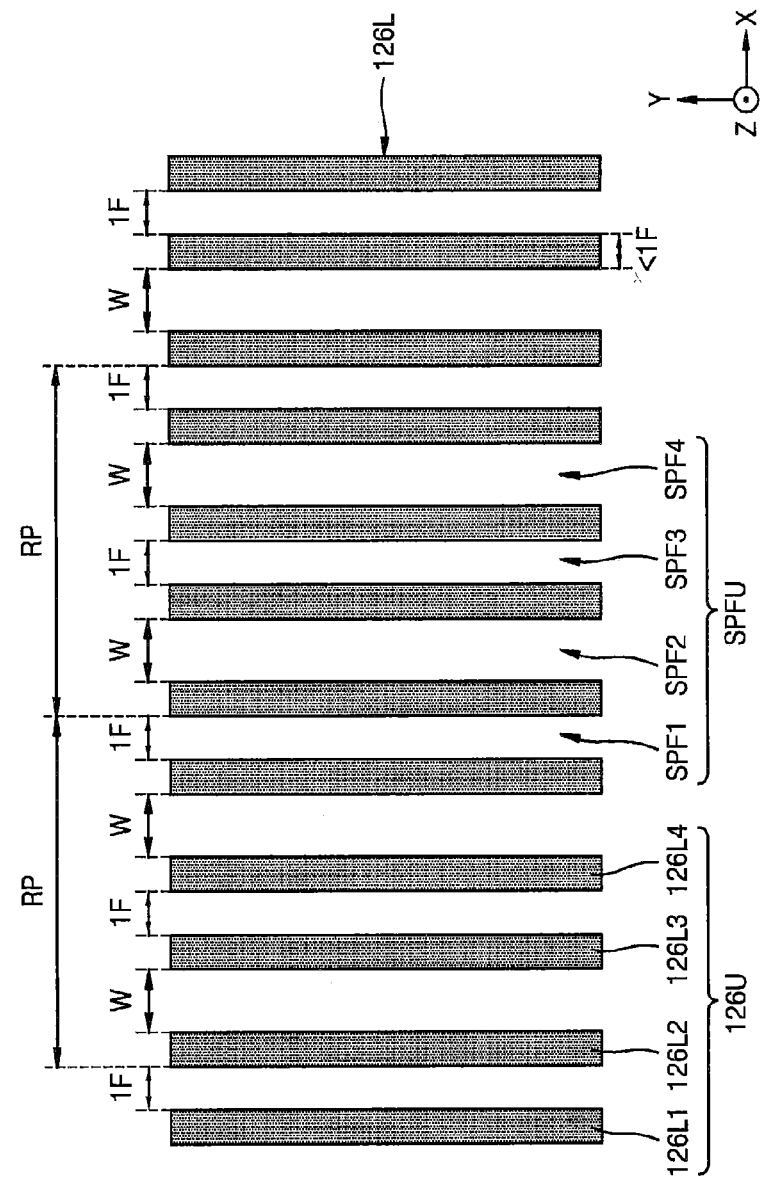

FIG. 9B illustrates a plurality of line patterns 126L that may be obtained when etching the feature layer 120 in a similar way as described with reference to FIG. 2I by using the plurality of second spacers 150S of FIG. 9A as an etch mask.

In the plurality of line patterns 126L of FIG. 9B, four line patterns 126L1, 126L2, 126L3, and 126L4 constituting one line repetition unit 126U may have a same width smaller than 1 F in the first direction (X direction).

A plurality of continuously arranged space repetition units SPFU having, as one space repetition unit SPFU, four spaces SPF1, SPF2, SPF3, and SPF4 continuously arranged in the first direction (X direction) and having variable widths may be provided between the plurality of line patterns 126L of FIG. 9B. In the four spaces SPF1, SPF2, SPF3, and SPF4 constituting the one space repetition unit SPFU, the first space SPF1 and the third space SPF3 may have a same width of 1 F. The second space SPF2 and the fourth space SPF4 may have a relatively larger width W, for example, the width W greater than 1 F.

Figure 9C:
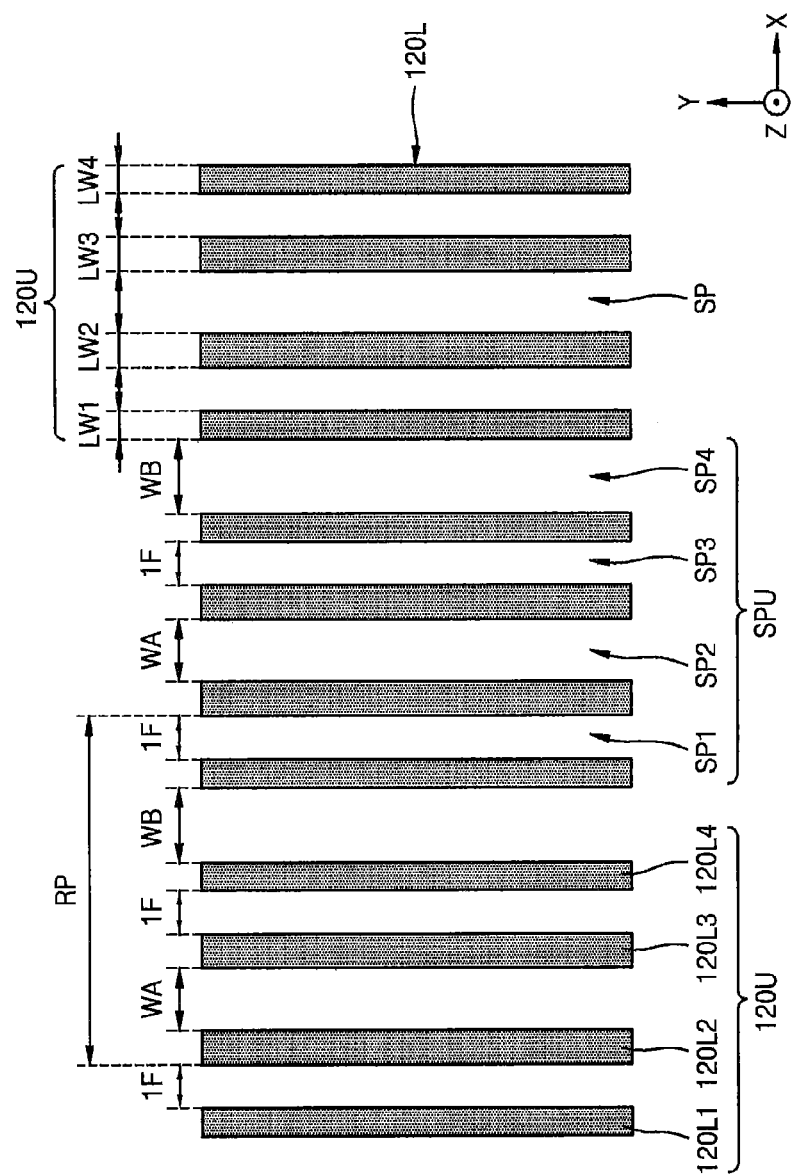

FIG. 9C is a plan view of the plurality of line patterns 120L having a different layout structure obtainable when forming the plurality of second spacers 150S according to a process of forming the plurality of second spacers 150S designed as shown in FIG. 9A.

In more detail, various process variations may occur until the plurality of second spacers 150S of FIG. 9A are formed. Accordingly, for example, the plurality of second spacers 150S having a layout structure of FIG. 2G may be obtained.

The plurality of line patterns 120L obtained by etching the feature layer 120 in a similar way as described with reference to FIG. 2I by using the plurality of second spacers 150S of FIG. 2G as an etch mask include the at least two continuous line repetition unit 126U having the four line patterns 120L1, 120L2, 120L3, and 120L4 continuously arranged in the first direction (X direction) and having variable widths as the one line repetition unit 120U as shown in FIG. 9C.

The four line patterns 120L1, 120L2, 120L3, and 120L4 constituting the one line repetition unit 120U may have a structure in which the first line pattern 120L1 having a width LW1 smaller than 1 F, the second line pattern 120L2 having a width LW2 greater than 1 F, the third line pattern 120L3 having a width LW3 greater than 1 F, and the fourth line pattern 120L4 having a width LW4 smaller than 1 F are sequentially arranged in the first direction (X direction).

As shown in FIG. 9C, the plurality of spaces SP are arranged between the plurality of line patterns 120L. The plurality of spaces SP may include the plurality of continuously arranged space repetition units SPU having the four spaces SP1, SP2, SP3, and SP4 continuously arranged in the first direction (X direction) and having variable widths according to locations as the one space repetition unit SPU. The four spaces SP1, SP2, SP3, and SP4 constituting the one space repetition unit SPU may include the first space SP1 having a width of 1 F, the second space SP2 having a width greater than 1 F, the third space SP3 having a width of 1 F, and the fourth space SP4 having a width greater than 1 F.

FIGS. 2A through 2J are cross-sectional views sequentially showing a method of manufacturing a semiconductor device, according to embodiments of the inventive concept. The same reference numerals denote the same elements between FIGS. 10A through 10E and FIGS. 2A through 9C, and thus detailed descriptions thereof are omitted for brevity of description.

Figure 10A:
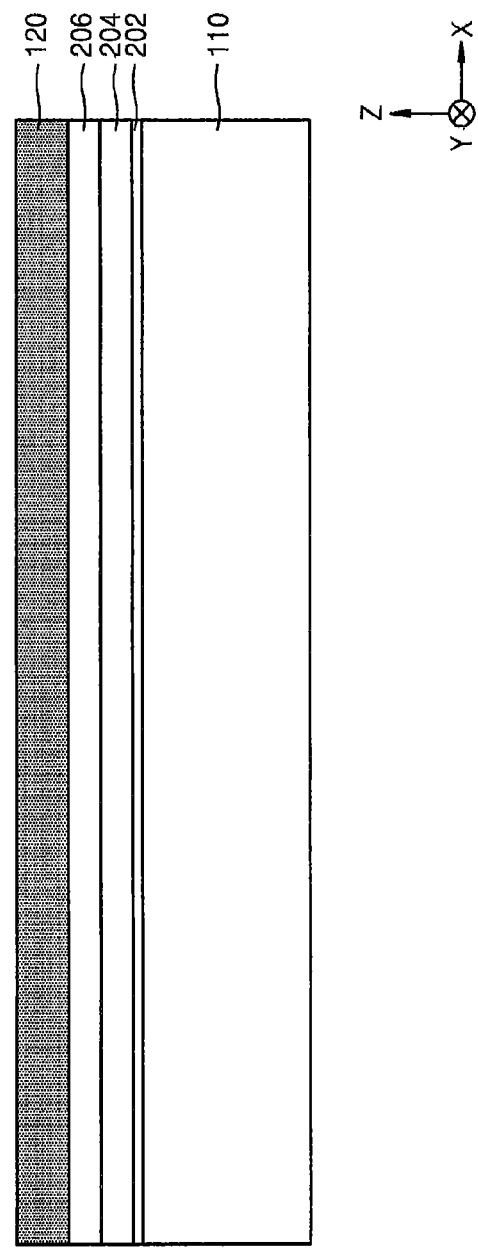
FIGS. 10A through 10E are cross-sectional views sequentially showing a method of manufacturing a semiconductor device, according to embodiments of the inventive concept.

Referring to FIG. 10A, a pad oxide film 202 is formed on the substrate 110. A first hard mask layer 204, a second hard mask layer 206, and the feature layer 120 are sequentially formed on the pad oxide film 202.

In some embodiments, each of the first hard mask layer 204 and the second hard mask layer 206 may be formed as a single layer. Alternatively, each of the first hard mask layer 204 and the second hard mask layer 206 may have a multilayer structure in which two or more hard mask layers having different etch characteristics are stacked under a predetermined etch condition. For example, the first hard mask layer 204 may be formed as a silicon nitride film. The second hard mask layer 206 may be formed as a silicon oxide film. In some embodiments, at least one of the first hard mask layer 204 and the second hard mask layer 206 may be omitted.

Figure 10B:
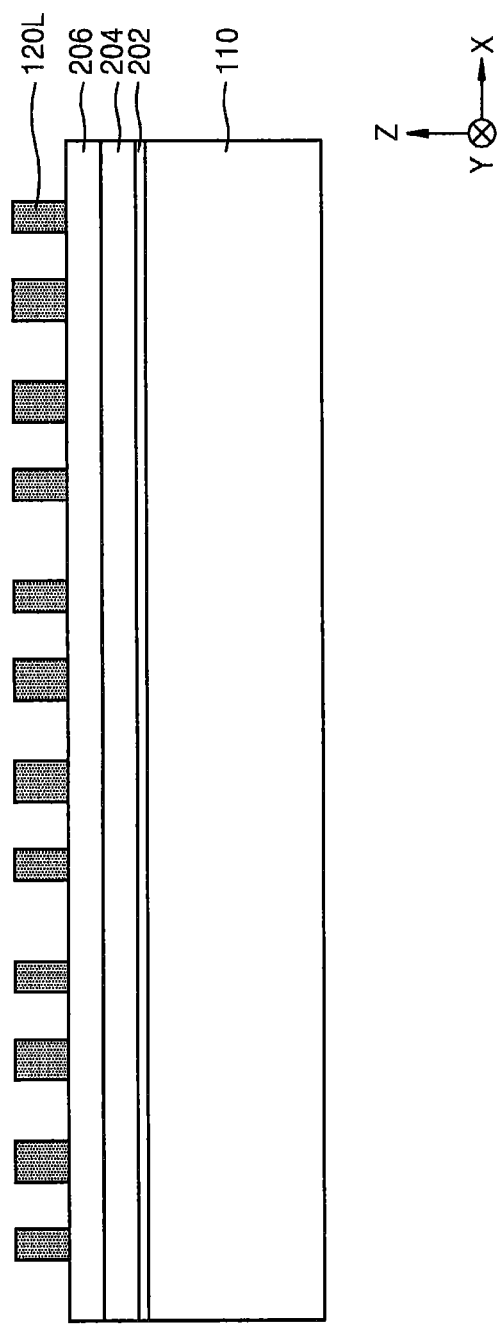

Referring to FIG. 10B, the plurality of line patterns 120L are formed by patterning the feature layer 120 by using a QPT process using the method described with reference to FIGS. 2A through 2J.

Figure 10C:
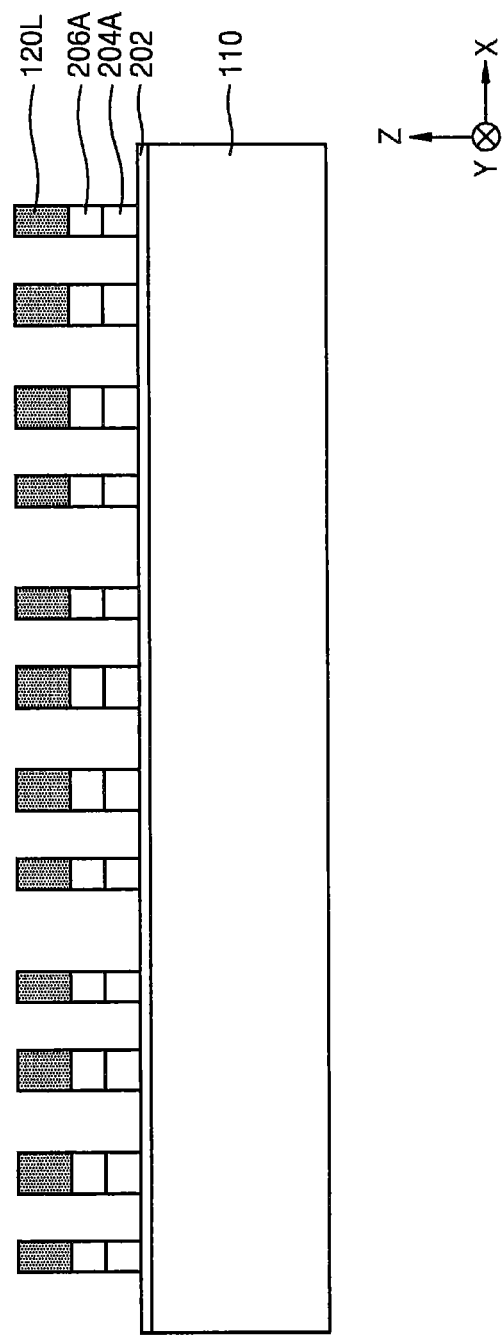

Referring to FIG. 10C, a plurality of first hard mask patterns 204A and a plurality of second hard mask patterns 206A are formed by sequentially etching the second hard mask layer 206 and the first hard mask layer 204 using the plurality of line patterns 120L as an etch mask.

Figure 10D:
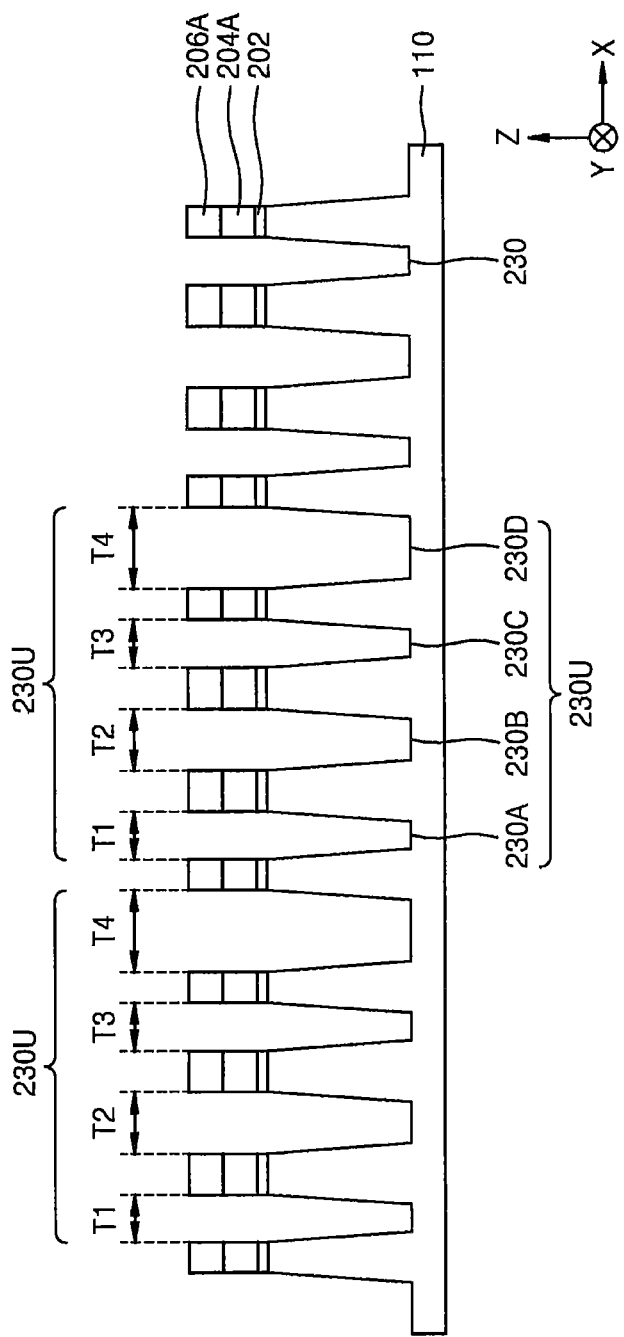

Referring to FIG. 10D, a plurality of trenches 230 are formed in the substrate 110 by etching the pad oxide film 202 and the substrate 110 using a plurality of first hard mask patterns 504A and a plurality of second hard mask patterns 506A as an etch mask.

Top surfaces of the plurality of second hard mask patterns 506A may be exposed by consuming or removing the plurality of line patterns 120L (see FIG. 10C) after forming the plurality of trenches 230.

The plurality of trenches 230 may include a plurality of continuously arranged trench repetition units 230U having the four trenches 230A, 230B, 230C, and 230D continuously arranged in the first direction (X direction) and having variable widths according to locations as the one trench repetition unit 230U. The four trenches 230A, 230B, 230C, and 230D constituting the one trench repetition unit 230U may include the first trench 230A having a relatively small width T1, the second trench 230B having a relatively large width T2, the third trench 230C having a relatively small width T3, and the fourth trench 230D having a relatively large width T4. In some embodiments, among the four trenches 230A, 230B, 230C, 230D constituting the one trench repetition unit 230U, the widths T1 and T3 of the first trench 230A and the third trench 230C may be the same, and the widths T2 and T4 of the second trench 230B and the fourth trench 230D may be the same.

A resultant structure of FIG. 10D as described above is merely one example that is selectable from various embodiments according to the inventive concept. The plurality of trenches 230 having various trench repetition units may be formed as shown in FIG. 10D within the scope of the inventive concept.

Figure 10E:
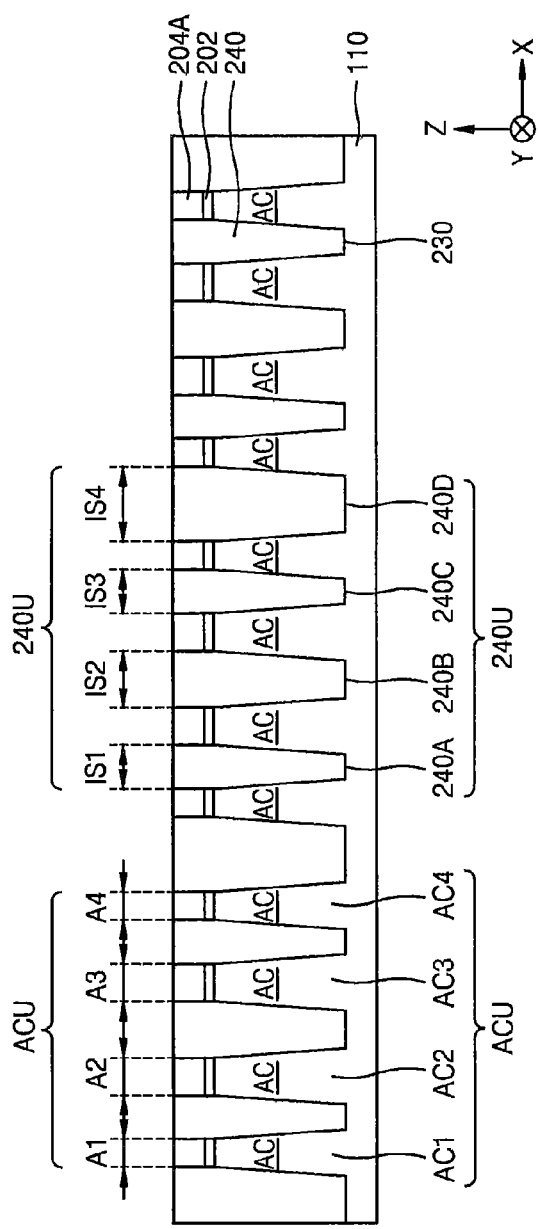

Referring to FIG. 10E, after an insulation material is deposited on the substrate 110 at a sufficient thickness to completely fill the plurality of trenches 230, a plurality of device isolation regions 240 are formed by filling an insulation film in the plurality of trenches 230 through a flattening process using a chemical mechanical polishing (CMP) process until the plurality of first hard mask patterns 204A are exposed.

A plurality of active regions AC are defined by the plurality of device isolation regions 240.

The plurality of active regions AC may have a line shape in which the plurality of active regions AC extend in parallel to each other.

The plurality of active regions AC may include a plurality of continuous active region repetition units ACU having, as one active region repetition unit ACU, four active regions AC1, AC2, AC3, and AC4 continuously arranged in the first direction (X direction) and having variable widths according to locations. The plurality of active region repetition units ACU may have a same width.

In some embodiments, the four active regions AC1, AC2, AC3, and AC4 constituting the one active region repetition unit ACU may have a structure in which the first active region AC1 having a relatively small width A1, the second active region AC2 having a relatively large width A2, the third active region AC3 having a relatively large width A3, and the fourth active region AC4 having a relatively small width A4 are sequentially arranged in the first direction (X direction). In some embodiments, among the four active regions AC1, AC2, AC3, and AC4 constituting the one active region repetition unit ACU, the widths A1 and A4 of the first active region AC1 and the fourth active region AC4 may be smaller than the widths A2 and A3 of the second active region AC2 and the third active region AC3. The widths A1 and A4 of the first active region AC1 and the fourth active region AC4 may be the same. The widths A2 and A3 of the second active region AC2 and the third active region AC3 may be the same.

The plurality of device isolation regions 240, in a similar way as described with respect to the plurality of trenches 230 of FIG. 10D, may include a plurality of continuously arranged device isolation region repetition units 240U having, as one device isolation region repetition unit 240U, four device isolation regions 240A, 240B, 240C, and 240D continuously arranged in the first direction (X direction) and having variable widths according to locations. The four device isolation regions 240A, 240B, 240C, and 240D constituting the one device isolation region repetition unit 240U may include the first device isolation region 240A having a relatively small width IS1, the second device isolation region 240B having a relatively large width IS2, the third device isolation region 240C having a relatively small width IS3, and the fourth device isolation region 240D having a relatively large width IS4. In some embodiments, among the four device isolation regions 240A, 240B, 240C, and 240D constituting the one device isolation region repetition unit 240U, the widths IS1 and IS3 of the first device isolation region 240A and the third device isolation region 240C may be smaller than the widths IS2 and IS4 of the second device isolation region 240B and the fourth device isolation region 240D. The widths IS1 and IS3 of the first device isolation region 240A and the third device isolation region 240C may be the same. The widths IS2 and IS4 of the second device isolation region 240B and the fourth device isolation region 240D may be the same.

Figure 11A:
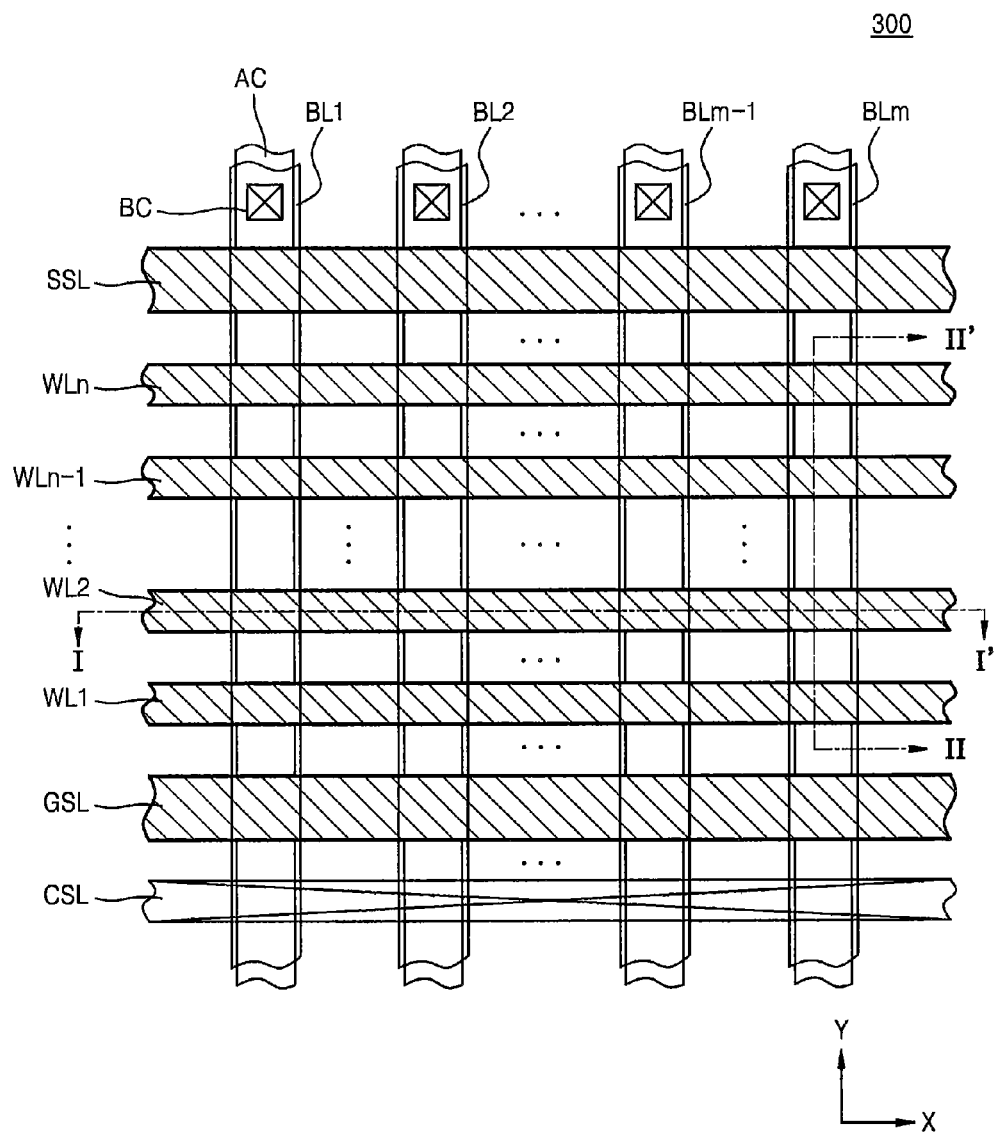
Figure 11B:
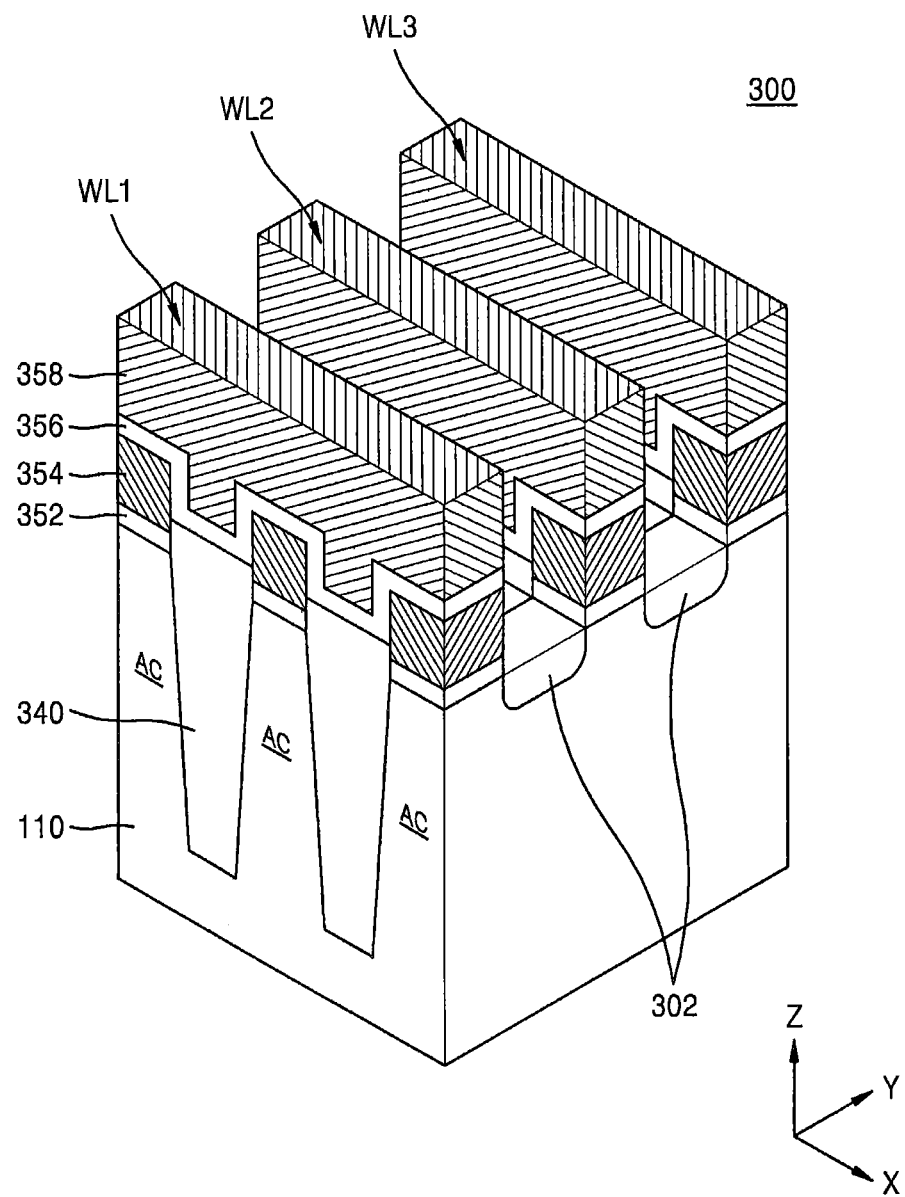

FIGS. 11A and 11B are diagrams illustrating a semiconductor device and a method of manufacturing the semiconductor device, according to various embodiments of the inventive concept, in which FIG. 11A is a layout of partial elements of a memory cell array 300 of a nonvolatile memory device according to an embodiment of the inventive concept, and FIG. 11B is a perspective view of partial elements of the memory cell array 300 of the nonvolatile memory device according to an embodiment of the inventive concept.

Partial elements of the memory cell array 300 of a NAND flash memory device that is an example of the nonvolatile memory device are shown in FIGS. 11A and 11B. In FIG. 11B, partial elements constituting the memory cell array 300 of the NAND flash memory device, for example, a bit line, are omitted. The same reference numerals denote the same elements between FIGS. 11A and 11B and FIGS. 2A through 10E, and thus detailed descriptions thereof are omitted.

Referring to FIGS. 11A and 11B, the memory cell array 300 may include the plurality of active regions AC defined by a plurality of device isolation regions 340 formed on the substrate 110. The plurality of active regions AC may be formed as a plurality of line patterns in parallel to each other.

A string selection line SSL and a ground selection line GSL that cross upper portions of the plurality of active regions AC may be provided on the plurality of active regions AC. A plurality of word lines WL1, WL2, . . . , WLn-1, and WLn that cross the upper portions of the plurality of active regions AC may be disposed between the string selection line SSL and the ground selection line GSL. The string selection line SSL, the ground selection line GSL, and the word lines WL1, WL2, . . . , WLn-1, and WLn may be parallel to each other.

A plurality of impurity regions 302 may be formed in the plurality of active regions AC adjacent to both sides of the word lines WL1, WL2, . . . , WLn-1, and WLn, the string selection line SSL, and the ground selection line GSL. Accordingly, a string selection transistor, memory cell transistors, and a ground selection transistor that are connected in serial may be formed. The string selection transistor, the ground selection transistor, and the memory cell transistors disposed therebetween may constitute one unit memory string.

The plurality of active regions AC adjacent to the string selection line SSL and positioned opposite to the ground selection line GSL may be defined as drain regions of string selection transistors. The plurality of active regions AC adjacent to the ground selection line GSL and positioned opposite to the string selection line SSL may be defined as source regions of the ground selection transistor.

The plurality of word lines WL1, WL2, . . . , WLn-1, and WLn may respectively extend in a direction crossing the plurality of active regions AC. The plurality of word lines WL1, WL2, . . . , WLn-1, and WLn may include a tunneling insulation layer 352, a charge storage layer 354, a blocking insulation layer 356, and a gate electrode layer 358 that are sequentially stacked on the substrate 110.

The tunneling insulation layer 352 and the charge storage layer 354 may have a structure in which the tunneling insulation layer 352 and the charge storage layer 354 are separated for each memory cell transistor adjacent in an extension direction of the plurality of word lines WL1, WL2, . . . , WLn-1, and WLn.

The tunneling insulation layer 352 may be formed of silicon oxide, silicon oxynitride, silicon oxide doped with impurities, or a low dielectric material having a lower dielectric constant than that of the silicon oxide. The charge storage layer 354 may be a charge trap layer or a conductive layer. The charge storage layer 354 may include a semiconductor doped with a dopant, for example, doped polysilicon. The charge storage layer 354 may be electrically insulated by the tunneling insulation layer 352 and the blocking insulation layer 356.

The blocking insulation layer 356 may be shared by the memory cell transistors adjacent in the extension direction of the plurality of word lines WL1, WL2, . . . , WLn-1, and WLn. The blocking insulation layer 356 may have a stack structure including a silicon oxide film, a silicon nitride film, or a combination of these. In some embodiments, the blocking insulation layer 356 may be formed as an oxide-nitride-oxide (ONO) film. Alternatively, the blocking insulation layer 356 may include a high dielectric (k) material having a higher dielectric constant than that of the silicon nitride.

The gate electrode layer 358 may be an electrode for controlling program and erasure operations. The gate electrode layer 358 may be formed to be connected to the memory cell transistors adjacent in the extension direction of the plurality of word lines WL1, WL2, . . . , WLn-1, and WLn. In some embodiments, the gate electrode layer 358 may be a conductive film including a doped semiconductor, a metal silicide, or a combination of these. For example, the gate electrode layer 358 may include doped polysilicon.

At least one of the string selection line SSL and the ground selection line GSL may have a same stack structure as that of the plurality of word lines WL1, WL2, . . . , WLn-1, and WLn in a region in which at least one of the string selection line SSL and the ground selection line GSL crosses the plurality of active regions AC. In some embodiments, the charge storage layer 354 and the gate electrode layer 358 may have an electrically connected structure. Widths of the string selection line SSL and the ground selection line GSL may be greater than widths of the plurality of word lines WL1, WL2, . . . , WLn-1, and WLn.

However, this is merely an example and the inventive concept is not limited thereto.

As shown in FIG. 11A, the memory cell array 300 may include a plurality of bit lines BL1, BL2, ..., BLm−1, and BLm crossing the upper portions of the plurality of word lines WL1, WL2, ..., WLn−1, and WLn. The plurality of bit lines BL1, BL2, ..., BLm−1, and BLm may connect a drain region of the string selection line SSL through a bit line contact BC. The plurality of bit lines BL1, BL2, ..., BLm−1, and BLm may be disposed in parallel to the plurality of active regions AC.

The plurality of active regions AC and/or the plurality of word lines WL1, WL2, ..., WLn−1, and WLn of FIGS. 11A and 11B may have a layout structure of one of the plurality of line patterns 120L of FIGS. 2J and 9C and the plurality of line patterns 121L, 122L, 123L, 124L, 125L, and 126L of FIGS. 8B and 9B, or a layout structure modified and changed within the inventive concept from these line patterns.

The plurality of device isolation regions 340 of FIG. 11B, in a similar way as the plurality of spaces SP of FIGS. 2J and 9C or the plurality of device isolation regions 240 of FIG. 10E, may include a plurality of continuously arranged device separation region repetition units having four device isolation regions continuously arranged in the first direction (X direction) and having variable widths according to locations as one device separation region repetition unit. In the plurality of device isolation regions 340, the one device separation region repetition unit may have a same or similar layout structure as described with respect to the space repetition unit SPU of the plurality of spaces SP of FIGS. 2J and 9C or the device separation region repetition unit 240U of the plurality of device isolation regions 240 of FIG. 10E.

Figure 12:
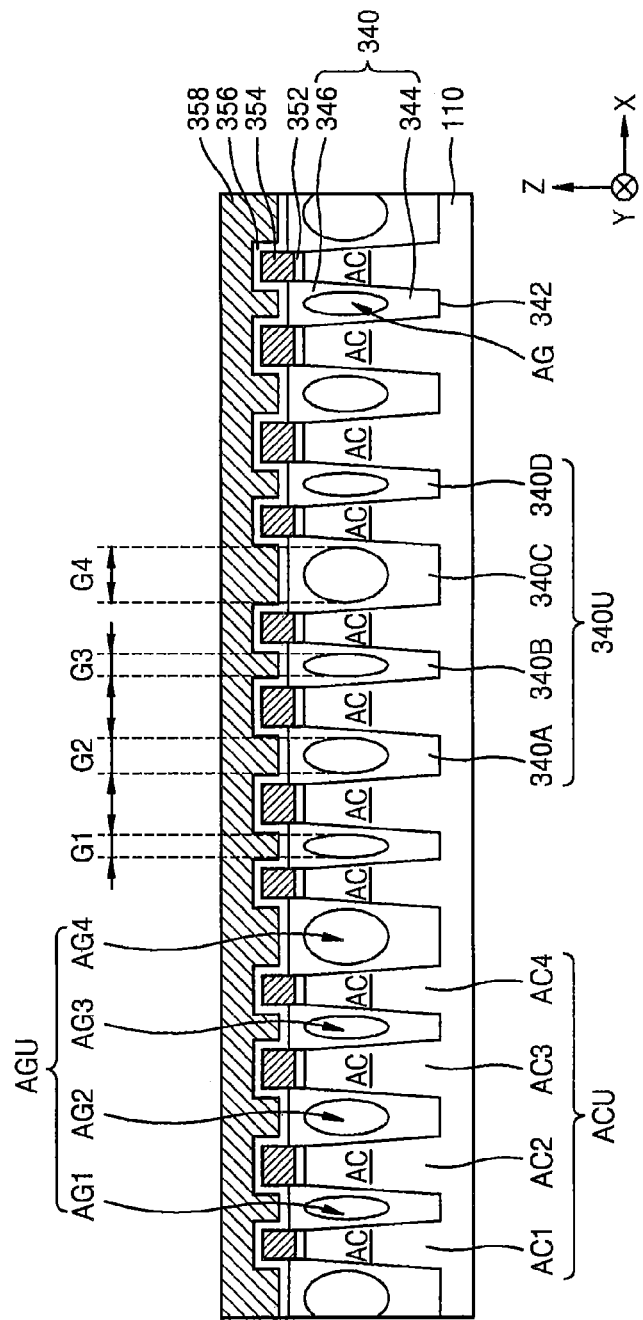
FIG. 12 is a diagram showing main elements of a semiconductor device, according to an embodiment of the inventive concept, and in more detail, is a cross-sectional view schematically showing partial elements of a part corresponding to a cross-section of a line I-I' of FIG. 11A.

FIG. 12 is a diagram showing main elements of a semiconductor device, according to an embodiment of the inventive concept, and in more detail, is a cross-sectional view schematically showing partial elements of a part corresponding to a cross-section of a line of FIG. 11A. The same reference numerals denote the same elements between FIG. 12 and FIGS. 11A and 11B, and thus detailed descriptions thereof are omitted.

Referring to FIG. 12, the plurality of device isolation regions 340 may include a plurality of device isolation air gaps AG each disposed in an inner portion of each of the plurality of device isolation regions 340.

In some embodiments, to form the plurality of device isolation air gaps AG, a first insulation film 344 providing bottom surfaces of the plurality of device isolation air gaps AG may be formed by depositing insulation materials to cover inner walls of the plurality of device isolation trenches 342 after etching a part of the substrate 110 and forming the plurality of device isolation trenches 342. The first insulation film 344 may constitute a part of the plurality of device isolation regions 340. The first insulation film 344 may be configured as an oxide film, a nitride film, or a combination of these. Thereafter, a second insulation film 346 may be formed on upper portions of the device isolation trenches 342 in such a way that the device isolation air gaps AG may remain in the device isolation trenches 342. When performing a deposition process for forming the second insulation film 346, a deposition process condition may be controlled such that inner spaces of the device isolation trenches 342 are not completely filled and the device isolation air gaps AG may remain. In some embodiments, in order that the device isolation air gaps AG may remain in the device isolation trenches 342 after forming the second insulation film 346, a process condition having a relatively deteriorated step coverage may be adopted during the deposition process of the second insulation film 346. In some embodiments, the second insulation film 346 may be formed as a high density plasma (HDP) oxide film or a tetraethylorthosilicate (TEOS) oxide film. The first insulation film 344 and the second insulation film 346 may constitute the plurality of device isolation regions 340. In some embodiments, the process of forming the first insulation film 344 may be omitted.

Cross-sectional shapes of the plurality of device isolation air gaps AG of FIG. 12 are merely an example and the inventive concept is not limited thereto. For example, the plurality of device isolation air gaps AG may have various cross-sectional shapes such as circular, oval, and polygonal shapes.

The plurality of device isolation air gaps AG may extend in parallel to each other in a second direction (Y direction). The plurality of device isolation air gaps AG are formed in the plurality of device isolation regions 340, which reduces parasitic capacitance between the plurality of active regions AC and the plurality of charge storage layers 354, thereby improving an operating characteristic and reliability of a memory cell.

The plurality of device isolation air gaps AG may include at least two continuous device isolation air gap repetition units AGU having four device isolation air gaps AG1, AG2, AG3, and AG4 continuously arranged in the first direction (X direction) and having variable widths according to locations as one device isolation air gap repetition unit AGU.

The one device isolation air gap repetition unit AGU includes the first device isolation air gap AG1 formed in a first device isolation region 340A, the second device isolation air gap AG2 formed in a second device isolation region 340B, the third device isolation air gap AG3 formed in a third device isolation region 340C, and the fourth device isolation air gap AG4 formed in a first device isolation region 340D among one device isolation region repetition unit 340U.

The first device isolation air gap AG1 may have a relatively small width G1 in the first direction (X direction). The second device isolation air gap AG2 neighbors the first device isolation air gap AG1 and may have a width G2 greater than that of the first device isolation air gap AG1 in the first direction (X direction). The third device isolation air gap AG3 neighbors the second device isolation air gap AG2 and may have a width G3 smaller than that of the second device isolation air gap AG2 in the first direction (X direction). The fourth device isolation air gap AG4 neighbors the third device isolation air gap AG3 and may have a width G4 greater than that of the third device isolation air gap AG3 in the first direction (X direction).

In some embodiments, the plurality of device isolation air gaps AG may not be formed in the at least one device isolation region 340 among the plurality of device isolation regions 340.

Figure 13:
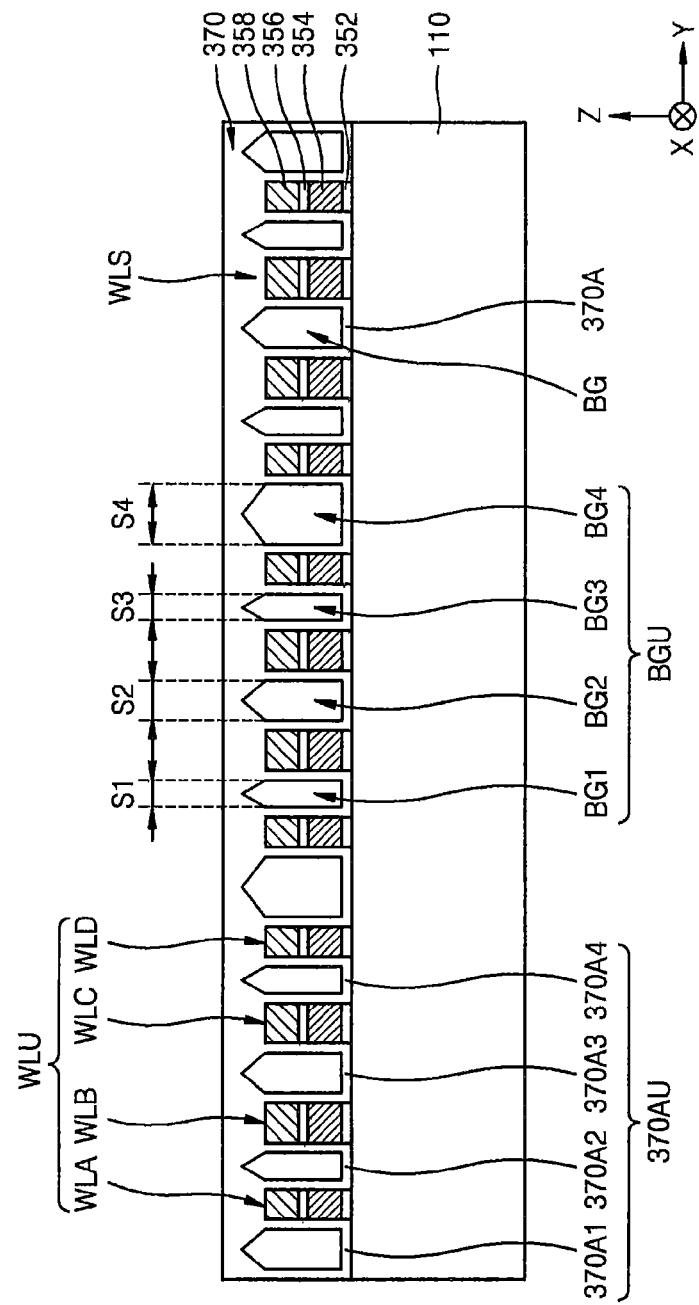
FIG. 13 is a diagram showing main elements of a semiconductor device, according to an embodiment of the inventive concept, and in more detail, is a cross-sectional view schematically showing partial elements of a part corresponding to a cross-section of a line II-II' of FIG. 11A.

FIG. 13 is a diagram showing main elements of a semiconductor device, according to an embodiment of the inventive concept, and in more detail, is a cross-sectional view schematically showing partial elements of a part corresponding to a cross-section of a line II-II' of FIG. 11A. The same reference numerals denote the same elements between FIG. 13 and FIGS. 11A and 11B, and thus detailed descriptions thereof are omitted.

Referring to FIG. 13, a plurality of word line structures WLS are formed on the substrate 110. The plurality of word line structures WLS may configure the plurality of word lines WL1, WL2, ..., WLn−1, and WLn of FIG. 11A. The plurality of word line structures WLS may include the tunneling insulation layer 352, the charge storage layer 354, the blocking insulation layer 356, and the gate electrode layer 358 that are sequentially stacked on the substrate 110.

The plurality of word line structures WLS may include a plurality of continuous word line repetition units WLU having four word line structures WLA, WLB, WLC, and WLD continuously arranged in the second direction (Y direction) and having variable widths according to locations as one word line repetition unit.

The plurality of continuous word line repetition units WLU constituting the plurality of word line structures WLS may have a layout structure of the repetition units 120U of the plurality of line patterns 120L of FIGS. 2J and 9C or a layout structure modified and changed within the inventive concept from these line patterns.

The plurality of word line structures WLS are covered by an insulation film 370. The insulation film 370 includes a plurality of inter-conductive line insulation regions 370A disposed between the plurality of word line structures WLS to fill spaces between the plurality of word line structures WLS.

The plurality of inter-conductive line insulation regions 370A may include a plurality of continuous insulation repetition units 370AU having, as one insulation repetition unit 370AU, four inter-conductive line insulation regions 370A1, 370A2, 370A3, and 370A4 continuously arranged in the second direction (Y direction) and having variable widths according to locations. The plurality of continuous insulation repetition units 370AU may have a same width.

The four inter-conductive line insulation regions 370A1, 370A2, 370A3, and 370A4 constituting the one insulation repetition unit 370AU may have a same or similar layout configuration as described with respect to the space repetition units SPU of the plurality of spaces SP of FIGS. 2J and 9C.

The plurality of inter-conductive line insulation regions 370A may include a plurality of insulation air gaps BG each disposed in each of the plurality of inter-conductive line insulation regions 370A.

In order that the plurality of insulation air gaps BG may be formed in the plurality of inter-conductive line insulation regions 370A of the insulation film 370, when forming the insulation film 370 on a resultant structure in which the plurality of word line structures WLS are formed on the substrate 110, a deposition process condition may be controlled such that spaces of the plurality of word line structures WLS are not completely filled and the plurality of insulation air gaps BG may remain. In order that the plurality of insulation air gaps BG may remain between the plurality of word line structures WLS after forming the insulation film 370, a process condition having a relatively deteriorated step coverage may be adopted during the deposition process of the insulation film 370. In some embodiments, the insulation film 370 may be formed as a HDP oxide film or a TEOS oxide film.

Cross-sectional shapes of the plurality of insulation air gaps BG of FIG. 13 are merely an example and the inventive concept is not limited thereto. For example, the plurality of insulation air gaps BG may have various cross-sectional shapes such as circular, oval, and polygonal shapes.

The plurality of insulation air gaps BG may extend in parallel to each other in a first direction (X direction). The plurality of insulation air gaps BG are formed in the plurality of inter-conductive line insulation regions 370A of the insulation film 370, which reduces word line coupling, thereby improving a threshold voltage distribution of a memory cell and an operating characteristic and reliability of the memory cell.

In some embodiments, the semiconductor device according to the inventive concept may include the plurality of device isolation regions 340 in which the plurality of device isolation air gaps AG are formed as shown in FIG. 12 and the insulation film 370 in which the plurality of insulation air gaps BG are formed as shown in FIG. 13. In this case, at least some of the plurality of device isolation air gaps AG may be connected to at least some of the plurality of insulation air gaps BG.

The plurality of insulation air gaps BG may include a plurality of continuous insulation air gap repetition units BGU having, as one insulation air gap repetition unit BGU, four insulation air gaps BG1, BG2, BG3, and BG4 continuously arranged in the second direction (Y direction) and having variable widths according to locations.

The one insulation air gap repetition unit BGU includes the first isolation air gap BG1 having a relatively small width S1 in the second direction (Y direction), the second isolation air gap BG2 neighboring the first isolation air gap BG1 and having a width S2 greater than that of the first isolation air gap BG1 in the second direction (Y direction), the third isolation air gap BG3 neighboring the second isolation air gap BG2 and having a width smaller than that of the second isolation air gap BG2 in the second direction (Y direction), and the fourth isolation air gap BG4 neighboring the third isolation air gap BG3 and having a width greater than that of the third isolation air gap BG3 in the second direction (Y direction).

Figure 14:
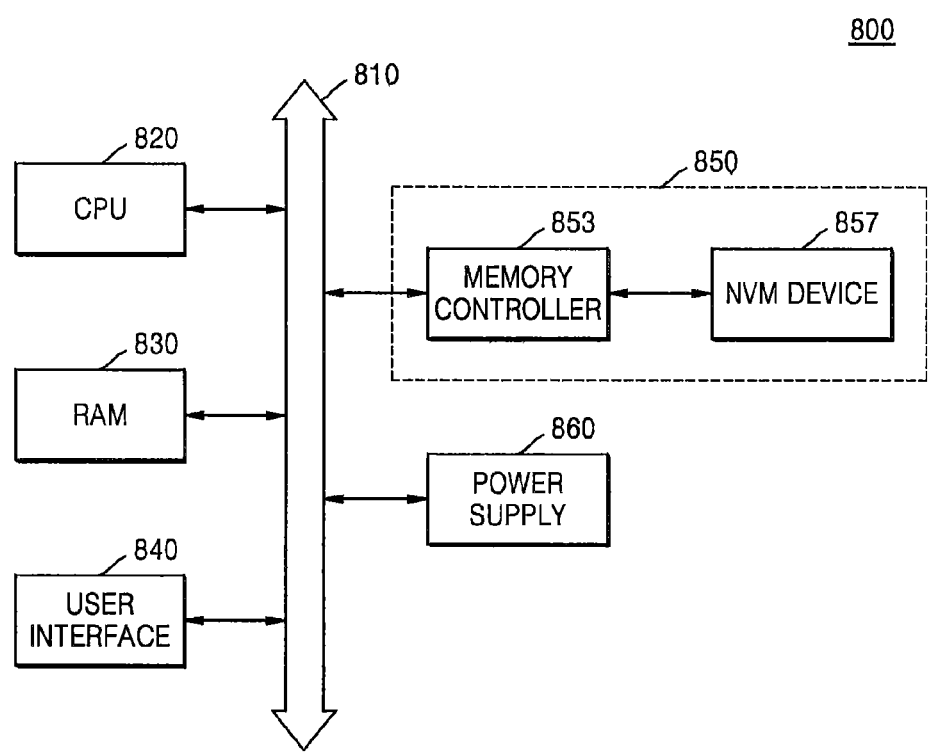
FIG. 14 is a block diagram of a memory system including a semiconductor device manufactured according to an embodiment of the inventive concept.

FIG. 14 is a block diagram of a memory system 800 including a semiconductor device manufactured by using a method according to an embodiment of the inventive concept.

Referring to FIG. 14, the memory system 800 includes a system bus 810, a central processing unit (CPU) 820, a random access memory (RAM) 830, a user interface (UI) 840, a non-volatile memory apparatus 850, and a power supply 860.

The non-volatile memory apparatus 850 is electrically connected to the memory system 800 via the system bus 810. The non-volatile memory apparatus 850 includes a memory controller 853 and a non-volatile memory apparatus 857. The non-volatile memory apparatus 857 stores data provided via the UI 840 or processed by the CPU 820 through the memory controller 853.

The memory system 800 includes at least one of the semiconductor devices according to the embodiments of the inventive concept described with reference to FIGS. 1 through 13 and semiconductor devices manufactured by using the methods according to embodiments of the inventive concept.

It is obvious to one of ordinary skill in the art that an application chipset, a camera image processor, etc. may be further provided to the memory system 800.

Figure 15:
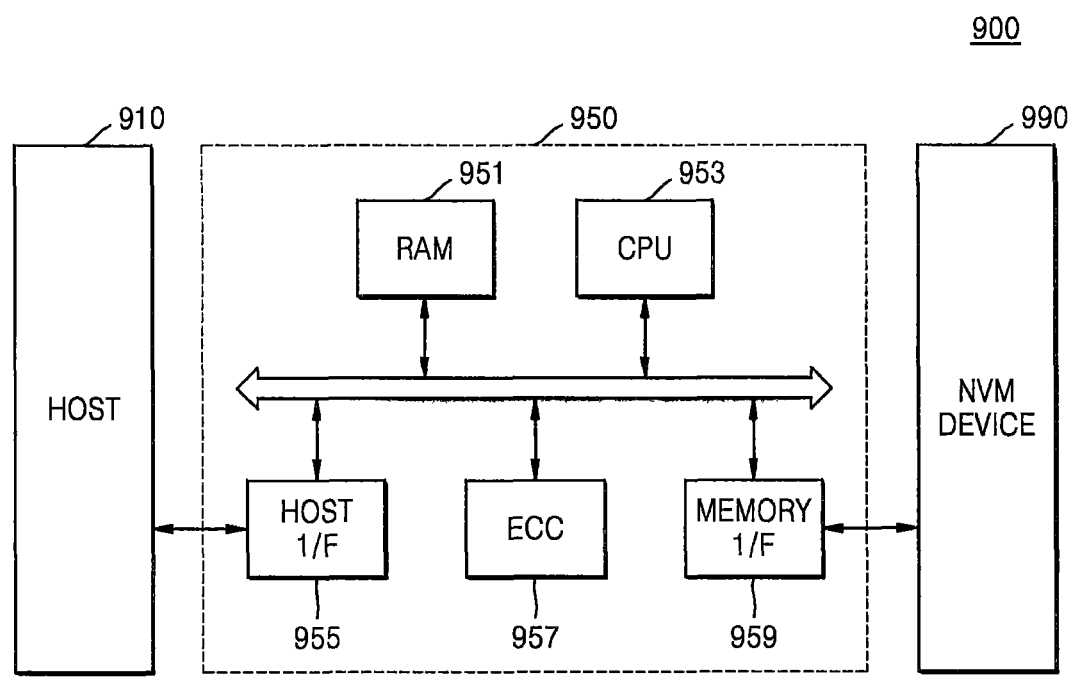
FIG. 15 is a block diagram of a memory system including a semiconductor device manufactured according to another embodiment of the inventive concept.

FIG. 15 is a block diagram of a memory system 900 including a semiconductor device manufactured by using a method according to another embodiment of the inventive concept.

Referring to FIG. 15, the memory system 900 may include a memory controller 950 and a non-volatile memory apparatus 990.

The memory controller 950 is connected to a host 910 and the non-volatile memory apparatus 990. The memory controller 950 is configured to access the non-volatile memory apparatus 990 in response to a request from the host 910. For example, the memory controller 950 is configured to control read, write, and erase operations of the non-volatile memory apparatus 990. The memory controller 950 is configured to be an interface between the non-volatile memory apparatus 990 and the host 910. The memory controller 950 is configured to drive firmware for controlling the non-volatile memory apparatus 990.

The memory controller 950 may include elements, such as a random access memory (RAM) 951, a CPU 953, a host interface 955, an error correcting code unit (CEE) 957, and a memory interface 959. The RAM 951 may be used as a working memory of the CPU 953. The CPU 953 may control a general operation of the memory controller 950.

The host interface 955 may include a protocol for performing a data exchange between the host 910 and the memory controller 950. For example, the memory controller 950 may be configured to communicate with the outside, for example, a host, through one of various interface protocols such as a USB (Universal Serial Bus) protocol, a MMC (Multimedia Card) protocol, s PCI (Peripheral Component Interconnection) protocol, s PCI-E (PCI-Express) protocol, an ATA (Advanced Technology Attachment) protocol, a SATA (Serial ATA) protocol, an SCSI (Small Computer Small Interface) protocol, an ESDI (Enhanced Small Disk Interface) protocol, and an IDE (Integrated Drive Electronics) protocol.

The ECC 957 may be configured to detect and correct an error of the data read from the memory apparatus 990. The ECC 957 may be provided as an element of the memory controller 950. As another example, the ECC 957 may be provided as an element of the non-volatile memory apparatus 990. The memory interface 959 may interface with the non-volatile memory apparatus 990. The memory system 900 may further include a read only memory (ROM) storing code data for interfacing with the host 910.

The memory controller 950 and the non-volatile memory apparatus 990 may be integrated into a single semiconductor apparatus to configure a memory card. For example, the memory controller 950 and the non-volatile memory apparatus 990 may be integrated into a single semiconductor apparatus to configure a PCMCIA (Personal Computer Memory Card International Association) card, a CF (Compact Flash) card, a Smart Media card, a Memory Stick card, a Multi Media card (MMC, RS-MMC, MMCmicro), an SD (Secure Digital) card (SD, Mini-SD, Micro-SD, SDHC), or an UFS (Universal Flash Storage).

As another example, the memory system 900 may be applied to at least one of a semiconductor drive (Solid State Drive: SSD), a computer, a portable Computer, an UMPC (Ultra Mobile Personal Computer), a work Station, a Net Book, a PDA (Personal Digital Assistant), a Web Tablet, a Wireless Phone, a Mobile Phone, a Digital Camera, a Digital Audio Recorder, a Digital Audio Player, a Digital Video Recorder, a Digital Video Player, n apparatus for transmitting and receiving information in a wireless environment, various electronic apparatuses constituting a Home Network, various electronic apparatuses constituting a Computer Network, various electronic apparatuses constituting a Telematics Network, various elements constituting a Computer System, an RFID (Radio Frequency Identification) apparatus or an Embedded System.

As another example, the non-volatile memory apparatus 990 or the memory system 900 may be mounted as various forms of packages. For example, the non-volatile memory apparatus 990 or the memory system 900 may be mounted by using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic MetricQuad Flat Pack (MQFP), Thin Quad Flatpack (TQFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a plurality of line patterns formed on a substrate,
   wherein the plurality of line patterns comprise at least two continuous line repetition units having, as one of the line repetition unit, four line patterns continuously arranged in a first direction and having variable widths based on location, wherein the at least two line repetition units have a same width, and continuously arranged in the first direction,
   wherein widths of the plurality of line patterns are defined by a plurality of spaces disposed between the plurality of line patterns,
   wherein the plurality of spaces comprise at least two continuous space repetition units having, as one space repetition unit, four spaces continuously arranged in the first direction and having variable widths based on location, and
   wherein the at least two space repetition units have a same width.

2. The semiconductor device of claim 1, wherein the one of the line repetition units included in the plurality of line patterns comprises:
   a first line pattern having a first width in the first direction;
   a second line pattern adjacent to the first line pattern and having a second width greater than the first width in the first direction;
   a third line pattern adjacent to the second line pattern and having a third width greater than the first width in the first direction; and
   a fourth line pattern adjacent to the third line pattern and having a fourth width smaller than the third width in the first direction.

3. The semiconductor device of claim 2, wherein the second width and the third width have a same size.

4. The semiconductor device of claim 2, wherein the first width and the fourth width have a same size.

5. The semiconductor device of claim 1, wherein one of the space repetition units included in the plurality of spaces comprises:
   a first space having a fifth width in the first direction;
   a second space adjacent to the first space and having a sixth width greater than the fifth width in the first direction;
   a third space adjacent to the second space and having a seventh width smaller than the sixth width in the first direction; and
   a fourth space adjacent to the third space and having an eighth width greater than the seventh width in the first direction.

6. The semiconductor device of claim 5, wherein the fifth width and the seventh width have a same size.

7. The semiconductor device of claim 5, wherein the sixth width and the eighth width have a same size.

8. The semiconductor device of claim 5, wherein the first width and the fifth width have a same size.

9. A semiconductor device comprising:
a plurality of device isolation regions defining a plurality of active regions in a plurality of line shapes extending in parallel to each other on a substrate,
wherein the plurality of active regions comprise at least two continuous active region repetition units having, as one of the active region repetition units, four active regions continuously arranged in a first direction and having variable widths based on location,
wherein the at least two active region repetition units have a same width, and continuously arranged in the first direction,
wherein the plurality of active regions and the plurality of device isolation regions are alternately arranged in the first direction,
wherein the plurality of device isolation regions comprise at least two continuous device isolation region repetition units having, as one of the device isolation region repetition units, four device isolation regions continuously arranged in the first direction and having variable widths based on location, and
wherein the at least two device isolation region repetition units have a same width.

10. The semiconductor device of claim 9, wherein the one of the active region repetition units comprises:
a first active region having a first width in the first direction;
a second active region adjacent to the first active region and having a second width greater than the first width in the first direction;
a third active region adjacent to the second active region and having a third width greater than the first width in the first direction; and
a fourth active region adjacent to the third active region and having a fourth width smaller than the third width in the first direction.

11. The semiconductor device of claim 10, wherein the second width and the third width have a same size.

12. The semiconductor device of claim 10, wherein the first width and the fourth width have a same size.

13. The semiconductor device of claim 9, wherein the plurality of device isolation regions comprise a plurality of device isolation air gaps each disposed in each of the plurality of device isolation regions,
wherein the plurality of device isolation air gaps comprise at least two continuous device isolation air gap repetition units having four device isolation air gaps continuously arranged in the first direction and having variable widths based on location as one device isolation air gap repetition unit.

14. A semiconductor device comprising:
a plurality of line patterns formed on a substrate;
wherein the plurality of line patterns define a plurality of spaces disposed therebetween, the plurality of spaces comprising at least two continuous space repetition units having; as one of the space repetition units, four spaces continuously arranged in a first direction and having variable widths based on location; and
wherein the at least two space repetition units have a same width and continuously arranged in the first direction.

15. The semiconductor device of claim 14, wherein one of the space repetition units included in the plurality of spaces comprises:
a first space having a first width in the first direction;
a second space adjacent to the first space and having a second width greater than the first width in the first direction;
a third space adjacent to the second space and having a third width smaller than the second width in the first direction; and
a fourth space adjacent to the third space and having a fourth width greater than the third width in the first direction.

16. The semiconductor device of claim 15, wherein the first width and the third width have a same size.

17. The semiconductor device of claim 15, wherein the second width and the fourth width have a same size.

18. The semiconductor device of claim 14, wherein the plurality of line patterns comprise at least two continuous line repetition units having, as one of the line repetition unit, four line patterns continuously arranged in a first direction and having variable widths based on location.

* * * * *